United States Patent
Xu et al.

(10) Patent No.: US 10,211,805 B2
(45) Date of Patent: Feb. 19, 2019

(54) MICRO-ELECTROMECHANICAL RESONATORS AND METHODS OF PROVIDING A REFERENCE FREQUENCY

(71) Applicant: Agency for Science, Technology and Research, Singapore (SG)

(72) Inventors: Jinghui Xu, Singapore (SG); Nan Wang, Singapore (SG); Yuandong Alex Gu, Singapore (SG)

(73) Assignee: Agency for Science, Technology and Research, Singapore (SG)

(*) Notice: Subject to any disclaimer, the term of this patent is extended or adjusted under 35 U.S.C. 154(b) by 274 days.

(21) Appl. No.: 15/114,734

(22) PCT Filed: Feb. 11, 2015

(86) PCT No.: PCT/SG2015/000038
§ 371 (c)(1),
(2) Date: Jul. 27, 2016

(87) PCT Pub. No.: WO2015/122840
PCT Pub. Date: Aug. 20, 2015

(65) Prior Publication Data
US 2016/0352309 A1    Dec. 1, 2016
US 2018/0054183 A2    Feb. 22, 2018

(30) Foreign Application Priority Data

Feb. 11, 2014 (SG) .................. 2014011472

(51) Int. Cl.
*H03H 9/15*    (2006.01)
*H03H 9/19*    (2006.01)
(Continued)

(52) U.S. Cl.
CPC .... *H03H 9/02409* (2013.01); *H03H 9/02448* (2013.01); *H03H 9/19* (2013.01);
(Continued)

(58) Field of Classification Search
CPC .. H03H 9/02409; H03H 9/02448; H03H 9/19; H03H 9/2457; H03H 9/2463;
(Continued)

(56) References Cited

U.S. PATENT DOCUMENTS

| 3,614,483 A | 10/1971 | Berlincourt |
| 8,349,611 B2 * | 1/2013 | Loverich .............. G01N 29/022 422/82.01 |

(Continued)

FOREIGN PATENT DOCUMENTS

| EP | 2479891 A1 | 7/2012 |
| WO | 2006130777 A2 | 12/2006 |

OTHER PUBLICATIONS

International Preliminary Report on Patentability for International Application No. PCT/SG2015/000038 dated Jan. 21, 2016, pp. 1-4.

*Primary Examiner* — Barbara Summons
(74) *Attorney, Agent, or Firm* — Winstead, P.C.

(57) ABSTRACT

According to various embodiments, there is provided a micro-electromechanical resonator, including a substrate with a cavity therein; and a resonating structure suspended over the cavity, the resonating structure having a first end anchored to the substrate, wherein the resonating structure is configured to flex in a flexural mode along a width direction of the resonating structure, wherein the width direction is defined at least substantially perpendicular to a length direction of the resonating structure, wherein the length direction is defined from the first end to a second end of the resonating structure, wherein the second end opposes the first end.

19 Claims, 25 Drawing Sheets

(51) Int. Cl.
  *H03H 9/46* (2006.01)
  *H03H 9/52* (2006.01)
  *H03H 9/54* (2006.01)
  *H03H 9/02* (2006.01)
  *H03H 9/56* (2006.01)
  *H03H 9/24* (2006.01)
  *H01H 1/00* (2006.01)

(52) U.S. Cl.
  CPC ........ *H03H 9/2457* (2013.01); *H03H 9/2463* (2013.01); *H03H 9/56* (2013.01); *B81B 2201/0271* (2013.01); *H01H 2001/0078* (2013.01); *H03H 2009/02291* (2013.01); *H03H 2009/02488* (2013.01)

(58) Field of Classification Search
  CPC ........... H03H 9/56; H03H 2009/02291; H03H 2009/02488; H03H 2009/02511; H01H 2001/0078; B81B 2201/0271
  USPC .................................................. 333/186, 188
  See application file for complete search history.

(56) References Cited

U.S. PATENT DOCUMENTS

| | | | |
|---|---|---|---|
| 8,487,715 B2* | 7/2013 | Mohanty | H03H 3/0072 333/101 |
| 8,587,183 B2 | 11/2013 | Chen et al. | |
| 8,587,390 B2 | 11/2013 | Kihara | |
| 8,772,999 B2* | 7/2014 | Mohanty | H03H 9/02244 310/309 |
| 2008/0100176 A1* | 5/2008 | Haskell | G01H 11/08 310/313 R |
| 2013/0209315 A1* | 8/2013 | Kimura | G01N 25/4826 422/88 |

* cited by examiner

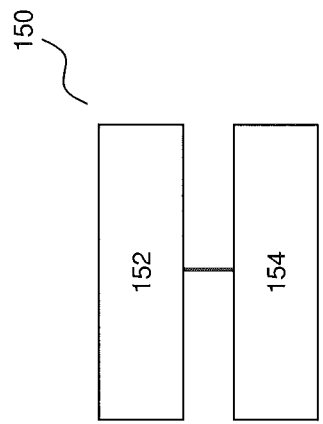
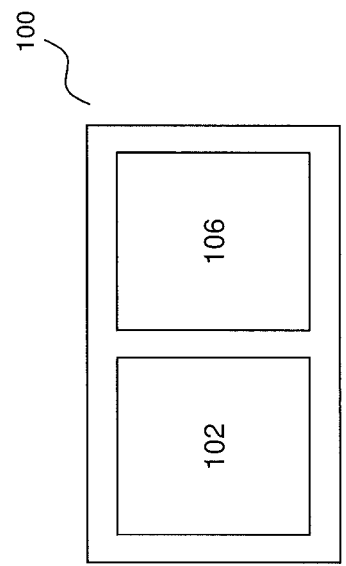
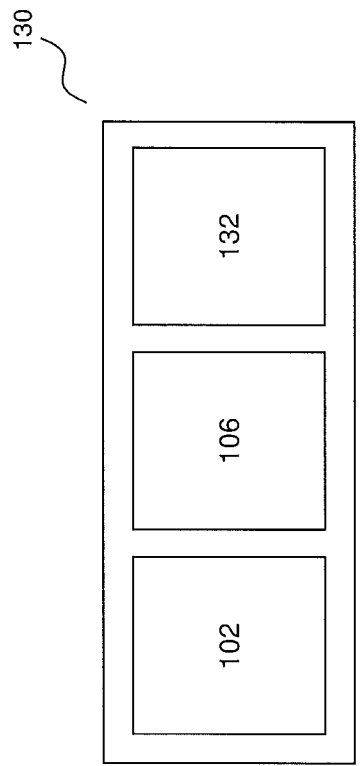

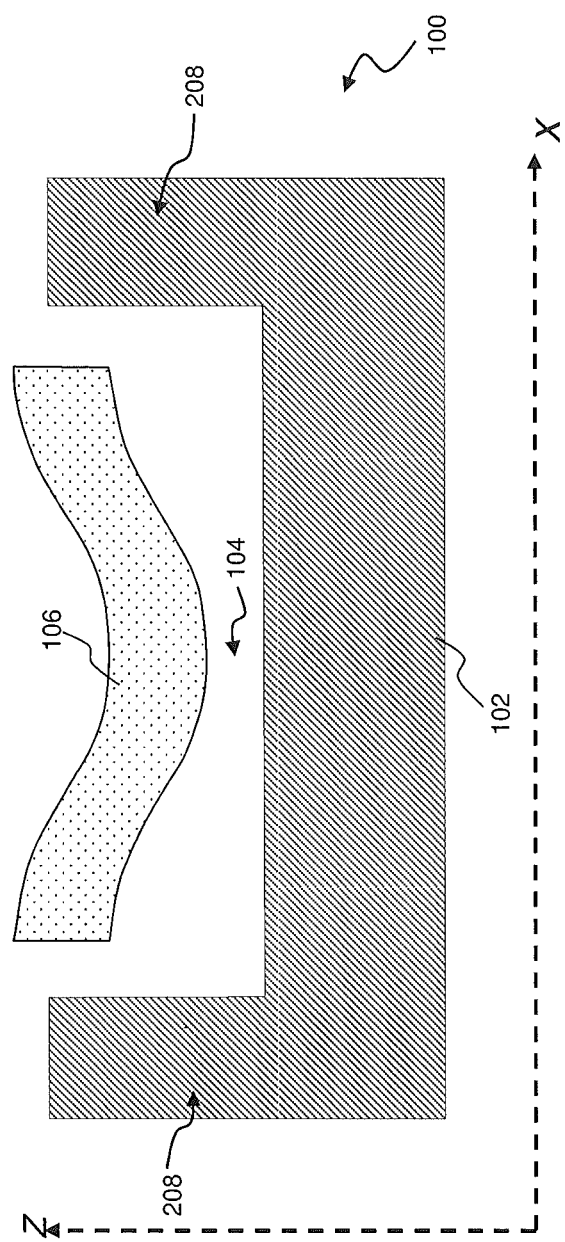

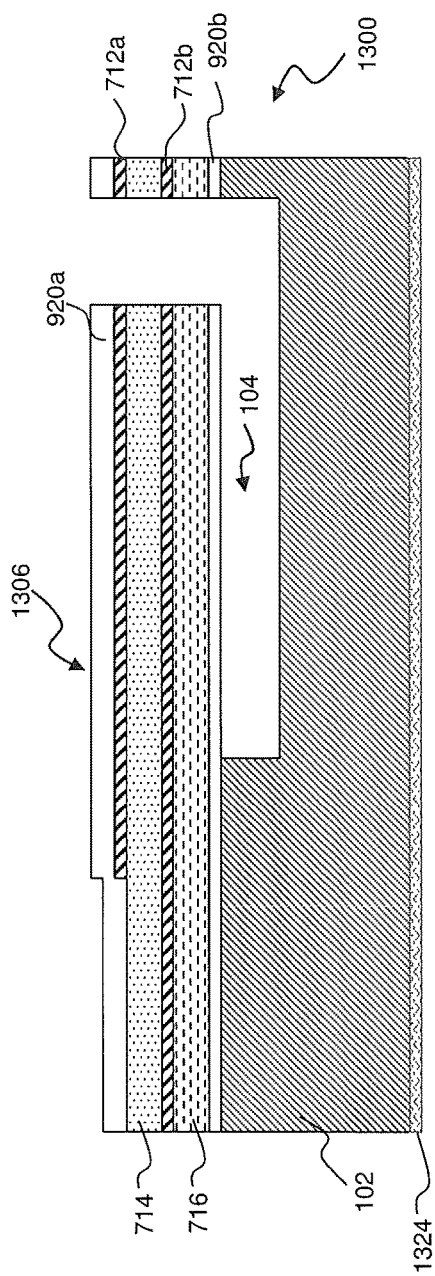
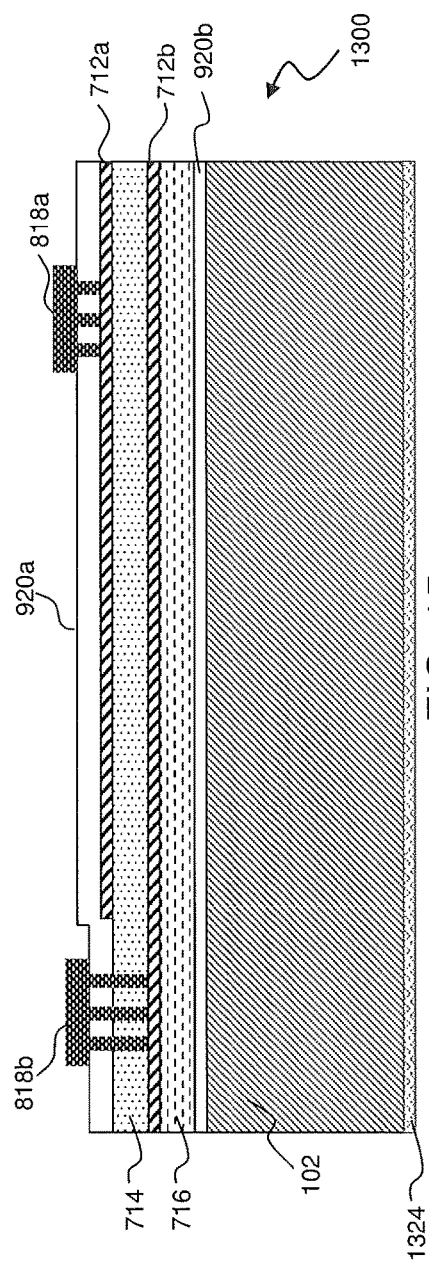

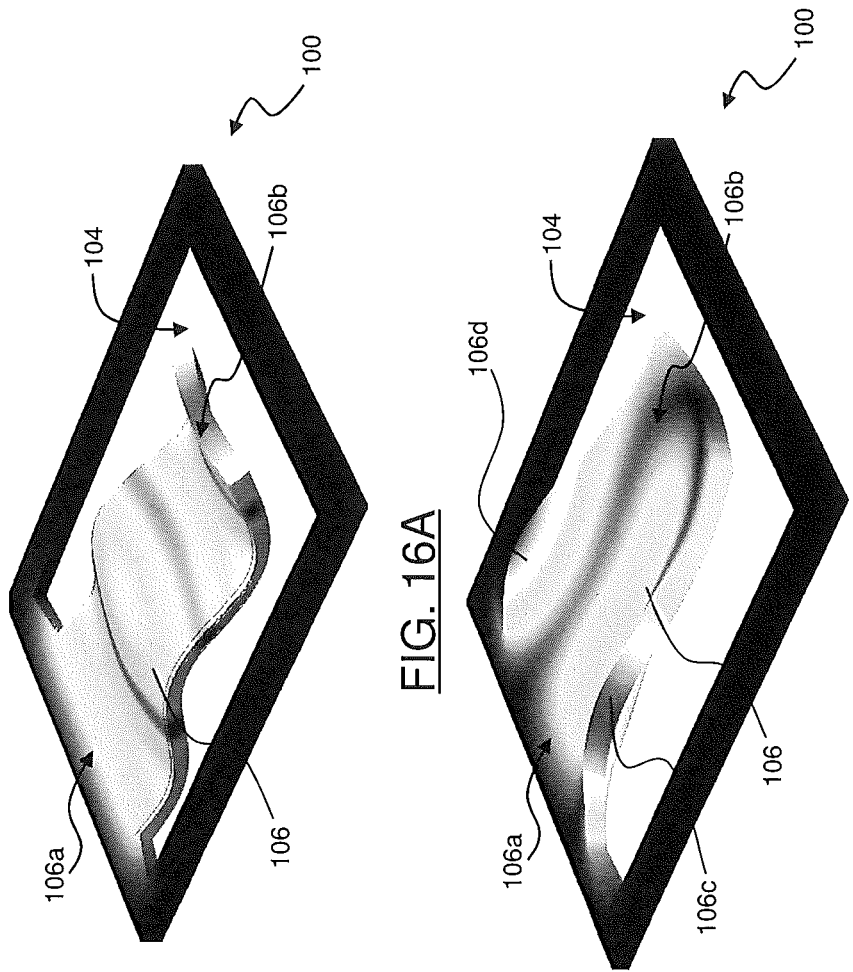

MICRO-ELECTROMECHANICAL RESONATORS AND METHODS OF PROVIDING A REFERENCE FREQUENCY

CROSS-REFERENCE TO RELATED APPLICATIONS

This application claims benefit of Singapore Patent Application number 2014011472 filed 11 Feb. 2014, which is incorporated in its entirety herein by reference.

TECHNICAL FIELD

The present invention relates to micro-electromechanical resonators and methods of providing a reference frequency.

BACKGROUND

A frequency reference oscillator is an important element in various timing and communication devices, such as real time clocks, wireless communications, medical equipment, environment monitoring applications, as well as consumer electronic products such as mobile phones, personal computers and cameras.

Quartz crystal oscillators, which are commonly used as frequency reference oscillators, are incompatible with integrated circuit fabrication. As a result, quartz-based reference oscillators require external circuitry to realize the oscillator, making such oscillators large in size and costly to fabricate.

Micro-Electromechanical System (MEMS) resonators have emerged as an attractive alternative to quartz crystal oscillators. MEMS resonators can be designed into integrated circuits and fabricated together with an integrated circuit. Therefore, MEMS resonators offer comparative advantages of decreased dimensions and lower fabrication cost over quartz crystal oscillators. So far, various types of silicon MEMS resonators have been demonstrated. In particular, a bulk-mode silicon MEMS resonator was characterized to have a high quality factor, for example more than one million. However, bulk-mode silicon MEMS resonators require high direct current (DC) bias voltage, which complicates the integrated circuit design as the voltage used in integrated circuits is well below the required DC bias voltage. Further, the bulk-mode silicon MEMS resonators need to be operated in vacuum, thereby necessitating costly vacuum packaging.

Therefore, there is a need for a new type of resonator that can be realized on an integrated circuit and have a high quality factor, while avoiding the aforementioned drawbacks.

SUMMARY

According to various embodiments, there may be provided a micro-electromechanical resonator, including a substrate with a cavity therein; and a resonating structure suspended over the cavity, the resonating structure having a first end anchored to the substrate, wherein the resonating structure is configured to flex in a flexural mode along a width direction of the resonating structure, wherein the width direction is defined at least substantially perpendicular to a length direction of the resonating structure, wherein the length direction is defined from the first end to a second end of the resonating structure, wherein the second end opposes the first end.

According to various embodiments, there may be provided a method of providing a reference frequency, the method including providing a micro-electromechanical resonator, the micro-electromechanical resonator including a substrate with a cavity therein, and a resonating structure suspended over the cavity, the resonating structure having a first end anchored to the substrate; and controlling the resonating structure to flex in a flexural mode along a width direction of the resonating structure, wherein the width direction is defined at least substantially perpendicular to a length direction of the resonating structure, wherein the length direction is defined from the first end to a second end of the resonating structure, wherein the second end opposes the first end.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments are described with reference to the following drawings, in which:

FIG. 1A shows a conceptual diagram of a MEMS resonator in accordance to various embodiments.

FIG. 1B shows a conceptual diagram of a MEMS resonator in accordance to various embodiments.

FIG. 1C shows a flow diagram of a method of providing a reference frequency, in accordance to various embodiments.

FIG. 4B shows an instantaneous widthwise cross-sectional view of the MEMS resonator of FIG. 2, when the MEMS resonator is operating in a width flexural mode.

FIG. 14 shows a lengthwise cross-sectional view of the MEMS resonator of FIG. 13.

FIG. 15 shows a widthwise cross-sectional view of the MEMS resonator of FIG. 13.

FIG. 16A shows a perspective view of a MEMS resonator according to various embodiments, operating in a length flexural mode.

FIG. 16B shows a perspective view of the MEMS resonator of FIG. 16A, operating in a width flexural mode.

DESCRIPTION

Figure 2:
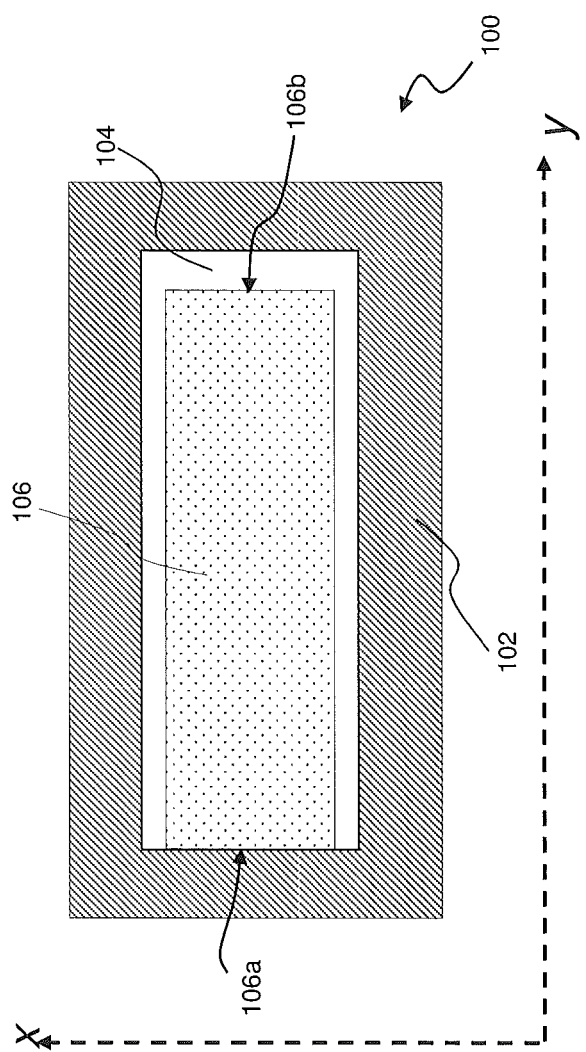
FIG. 2 shows a top view of a MEMS resonator in accordance to various embodiments.

Embodiments described below in context of the devices are analogously valid for the respective methods, and vice versa. Furthermore, it will be understood that the embodiments described below may be combined, for example, a part of one embodiment may be combined with a part of another embodiment.

In this context, the resonator as described in this description may include a memory which is for example used in the processing carried out in the resonator. A memory used in the embodiments may be a volatile memory, for example a DRAM (Dynamic Random Access Memory) or a non-volatile memory, for example a PROM (Programmable Read Only Memory), an EPROM (Erasable PROM), EEPROM (Electrically Erasable PROM), or a flash memory, e.g., a floating gate memory, a charge trapping memory, an MRAM (Magnetoresistive Random Access Memory) or a PCRAM (Phase Change Random Access Memory).

In an embodiment, a "circuit" may be understood as any kind of a logic implementing entity, which may be special purpose circuitry or a processor executing software stored in a memory, firmware, or any combination thereof. Thus, in an embodiment, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

A frequency reference oscillator is an important element in various timing and communication devices, such as real time clocks, wireless communications, medical equipment, environment monitoring applications, as well as consumer electronic products such as mobile phones, personal computers and cameras. Quartz crystal oscillators, which are commonly used as frequency reference oscillators, are incompatible with integrated circuit fabrication. As a result, quartz-based reference oscillators require external circuitry to realize the oscillator, making such oscillators large in size and costly to fabricate.

MEMS resonators have emerged as an attractive alternative to quartz crystal oscillators. MEMS resonators can be designed into integrated circuits and fabricated together with an integrated circuit. Therefore, MEMS resonators offer comparative advantages of decreased dimensions and lower fabrication cost over quartz crystal oscillators. So far, various types of silicon MEMS resonators have been demonstrated. In particular, a bulk-mode silicon MEMS resonator was characterized to have a high quality factor. However, bulk-mode silicon MEMS resonators require high direct current (DC) bias voltage, which complicates the integrated circuit design as the voltage used in integrated circuits is well below the required DC bias voltage. Further, the bulk-mode silicon MEMS resonators need to be operated in vacuum, thereby necessitating costly vacuum packaging. Therefore, there is a need for a new type of resonator that can be realized on an integrated circuit and have a high quality factor, while avoiding the aforementioned drawbacks.

The present disclosure relates to width-flexural mode micromechanical resonators which operate in a flexural mode along the width of the resonator and can be optimized as a functional element in oscillators for various frequency reference applications such as timing and chemical sensing.

The MEMS resonator is a width-flexural mode micromechanical resonator having a resonating structure which is of beam structure, with parts of its periphery attached and fixed to at least one anchor and thus not able to move during operation. The resonating structure may be excited to an out-of-plane vibration along a width of the resonator by an actuation mechanism, whereby the resonant frequency of the resonator is mainly determined by the width and the thickness of the resonator. In such a configuration, the width-flexural mode resonator may have a high quality factor when operating in air due to a reduced air damping coefficient associated with the width flexural mode. Therefore, vacuum packaging may not be required for the MEMS resonator, unlike in the case of other flexural mode resonators. By doing away with the need of vacuum packaging, the fabrication cost and the size of the resonator can be reduced. Furthermore, DC bias is not required for excitation of the resonator and this will ease the integrated circuit design complexity.

FIG. 1A shows a MEMS resonator 100 in accordance to various embodiments. The MEMS resonator 100 may include a substrate 102 with a cavity therein. The MEMS resonator 100 may further include a resonating structure 106 having a first end anchored to the substrate 102. The resonating structure 106 may be suspended over a cavity in the substrate 102. The resonating structure 106 may be configured to flex in a flexural mode along a width direction of the resonating structure 106. The width direction of the resonating structure 106 may be defined at least substantially perpendicular to a length direction of the resonating structure 106. The length direction may be defined from the first end to a second end of the resonating structure 106, wherein the second end opposes the first end.

FIG. 1B shows a MEMS resonator 130 in accordance to various embodiments. The MEMS resonator 130 may include, similar to the MEMS resonator 100 of FIG. 1A, a substrate 102 with a cavity therein. The MEMS resonator 130 may also include, similar to the MEMS resonator 100 of FIG. 1A, a resonating structure 106 having a first end anchored to the substrate 102. The resonating structure 106 may be suspended over a cavity in the substrate 102. The resonating structure 106 may be configured to flex in a flexural mode along a width direction of the resonating structure 106. The width direction of the resonating structure 106 may be defined at least substantially perpendicular to a length direction of the resonating structure 106. The length direction may be defined from the first end to a second end of the resonating structure 106, wherein the second end opposes the first end. The MEMS resonator 130 may further include a control circuit 132. The control circuit 132 may be configured to apply an alternating current voltage to the resonating structure 106 for generating an alternating electric field to induce mechanical deformation in the resonating structure 106.

FIG. 1C shows a flow diagram 150 illustrating a method for providing a reference frequency according to various embodiments. In 152, a MEMS resonator including a substrate with a cavity therein and a resonating structure having a first end anchored to the substrate, may be provided. The resonating structure may be suspended over the cavity in the substrate. The resonating structure may be configured to flex in a flexural mode along a width direction of the resonating structure. The width direction of the resonating structure may be defined at least substantially perpendicular to a length direction of the resonating structure. The length direction may be defined from the first end to a second end of the resonating structure, wherein the second end opposes the first end. In 154, the resonating structure may be controlled to flex in a flexural mode along a width direction of the resonating structure. The width direction may be defined at least substantially perpendicular to a length direction of the resonating structure. The length direction may be defined from the first end to a second end of the resonating structure, wherein the second end opposes the first end.

FIG. 2 shows a top view of a MEMS resonator 100 in accordance to various embodiments. The resonator 100 may include a substrate 102 and a resonating structure 106. The substrate 102 may have a cavity 104 formed within the substrate 102. The resonating structure 106 may have a first end 106a anchored to the substrate 102 and the remaining portion of the resonating structure 106 may be suspended over the cavity 104 in the substrate 102. The resonating structure 106 has a second end 106b, opposite of the first end 106a. The resonating structure length may be defined from the first end 106a to the second end 106b of the resonating structure 106 and the resonating structure width may be defined in, a direction at least substantially perpendicular to the length direction. The resonating structure 106 may be configured to flex in a width flexural mode. The length of the resonating structure 106 may be longer than its width, but is preferably less than twice the width.

The substrate 102 may be formed from any suitable material used for semiconductor fabrication, such as silicon or silicon-on-insulator. The cavity 104 may be formed within the substrate 102 by conventional semiconductor manufacturing processes. The cavity 104 may be a space defined within the substrate 102, surrounded by a plurality of surfaces of the substrate 102.

For the benefit of clarity, the plane in which the resonating structure 106 lies is defined as the xy-plane while the direction perpendicular to the xy-plane is defined as the z-axis. The directions of the x-axis and y-axis are illustrated in FIG. 2. The same definitions of the x-axis, y-axis and z-axis will be used throughout the description.

The resonating structure 106 may be smaller than the cavity 104, as measured in the xy-plane. The width and length of the resonating structure 106 are smaller than the width and length of the cavity 104, respectively. The directions for measuring cavity length and cavity width are at least substantially parallel to the directions for measuring the resonator length and the resonator width, respectively. The resonating structure can be very small in size, for example, at about 100 um by 200 um.

Figure 3:
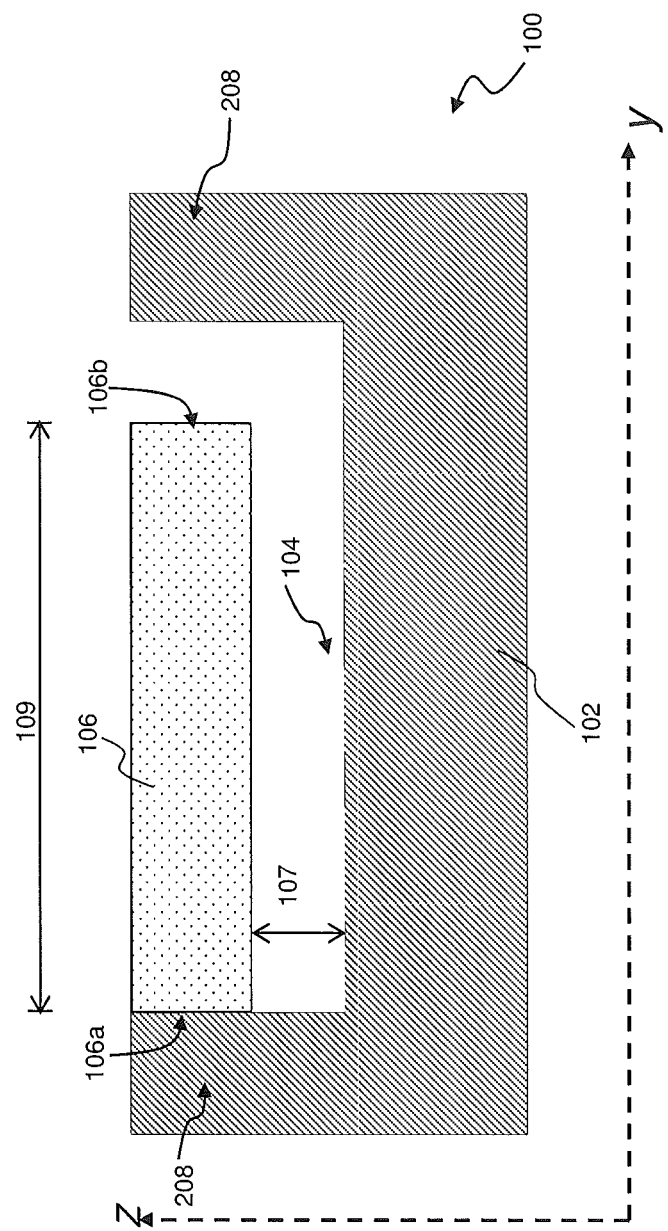
FIG. 3 shows a lengthwise cross-sectional view of the MEMS resonator of FIG. 2.

FIG. 3 shows a lengthwise cross-sectional view of the MEMS resonator 100 of FIG. 2. As can be seen from FIG. 3, the substrate 102 may have a cavity 104 formed therein. The resonating structure 106 may have at least one end anchored to the substrate 102 such that the at least one anchored end is not moveable. The resonating structure 106 may be coupled to a anchor block 208, which in turn, may be coupled to the substrate 102. The anchor block 208 anchors the at least one end of the resonating structure 106 to the substrate 102. The remaining portion of the resonating structure 106 may be suspended over the cavity 104. The length of the resonating structure 106 may be defined by the distance between the first end 106a and the second end 106b, in a direction substantially parallel to the y-axis. The resonating structure length 109 is indicated in FIG. 3. The anchor block 208 may be integral to the substrate 102, formed for example, through etching of the substrate 102. Alternatively, the anchor block 208 may also be formed from deposition of other materials on the substrate 102, or formed from a combination of etching of the substrate 102 and deposition of other materials on the substrate 102. The cavity 104 is preferably at least 0.1 um in depth. The cavity depth is also known as an air gap size 107, which is a z-axis distance between the resonating structure and the substrate.

Figure 4A:
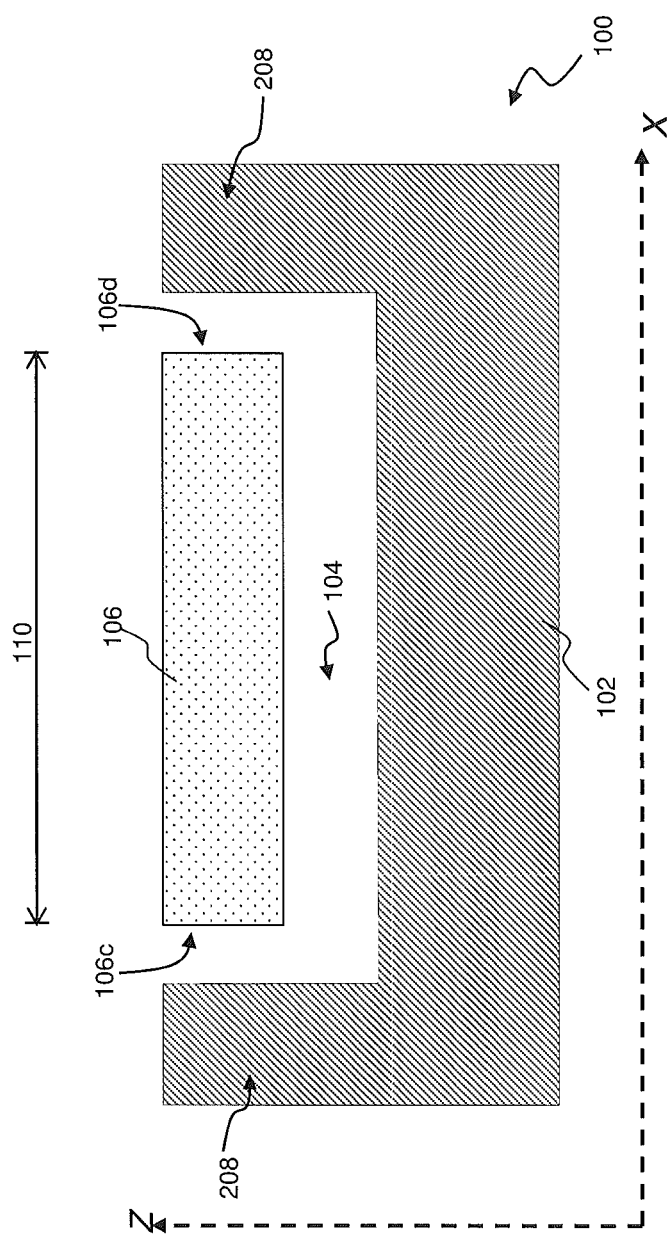
FIG. 4A shows a widthwise cross-sectional view of the MEMS resonator of FIG. 2.

FIG. 4A shows a widthwise cross-sectional view of the MEMS resonator 100 of FIG. 2. The width of the resonating structure 106 may, be measured between two sides of the resonating structure 106c and 106d, in a direction substantially parallel to the x-axis and substantially perpendicular to the resonating structure length. The resonating structure width 110 is indicated in FIG. 4A.

FIG. 4B shows an instantaneous widthwise cross-sectional view of the resonator 100 of FIG. 2, when the resonator 100 is operating in its width-flexural mode. When the resonator 100 is operated, the resonating structure 106 flexes out of the xy-plane. In flexing out of the xy-plane, the displacement of the resonating structure 106 may be in the direction of the z-axis. The z-axis displacement shifts along the width of the resonating structure, i.e. the x-axis, with respect to time. In other words, the flexural vibrations of the resonating structure may be understood to be similar to a transverse travelling wave, wherein the wave propagates along the width direction, i.e. x-axis of the resonating structure.

The resonating structure 106 may be operated through an actuation mechanism. The resonating structure 106 may include an actuation mechanism, for example, piezoelectric actuation. As the resonating structure 106 may have a length which is different from its width, the resonator 100 inherently may have different natural resonant frequencies corresponding to a length flexural mode and a width flexural mode. When the actuation mechanism supplies an actuating force to the resonating structure 106 with a frequency that matches at least one of the natural resonant frequencies of the resonator 100, the resonator 100 may be driven into a resonance condition with similar characteristics as an electric resonant circuit. The frequency of the actuating force may be chosen to be substantially similar to the natural resonant frequency of the resonator 100 corresponding to the width flexural mode. The resonator functions as a highly selective frequency filter, whereby it receives an actuating force having a frequency near to the desired frequency and generates oscillations having a frequency substantially equal to the desired frequency. Oscillations in the width flexural mode may experience lesser an damping, as compared to the length flexural mode, thereby achieving a higher quality factor for the resonator 100 even for operation in air. As such, the resonator cavity 104 may not have to be hermetically sealed to achieve the desired high quality factor.

Figure 5B:
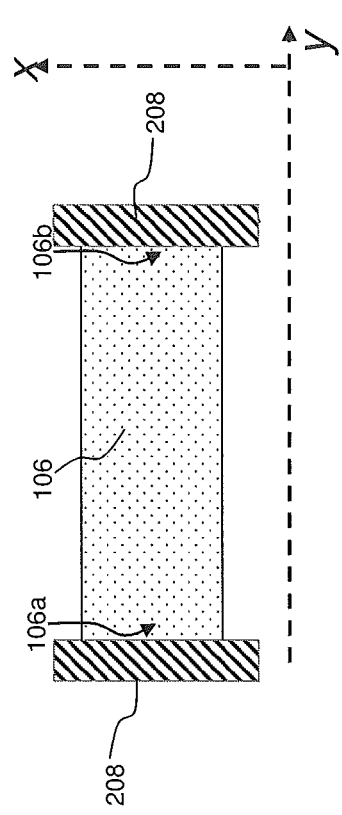
FIGS. 5A to 5D show top views of various MEMS resonators in accordance to various embodiments.
Figure 5D:
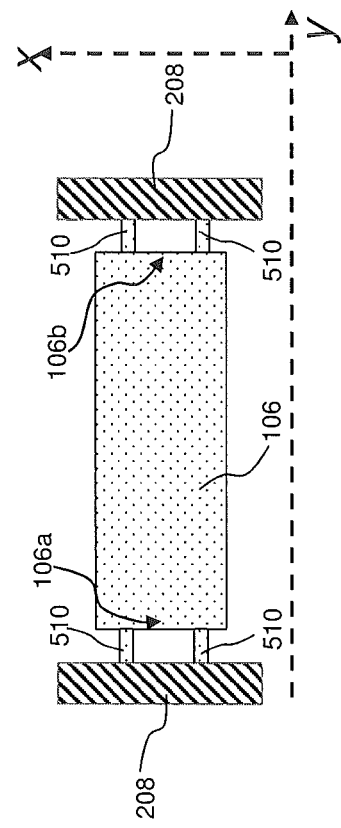
Figure 5A:
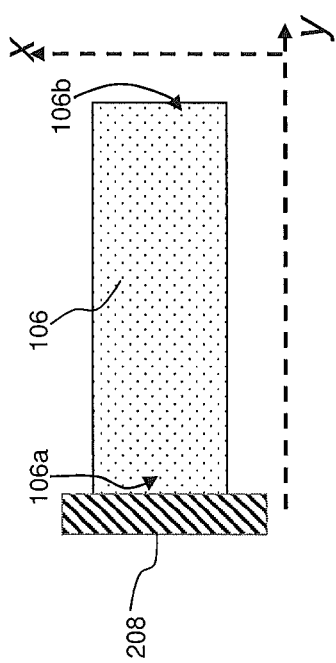
Figure 5C:
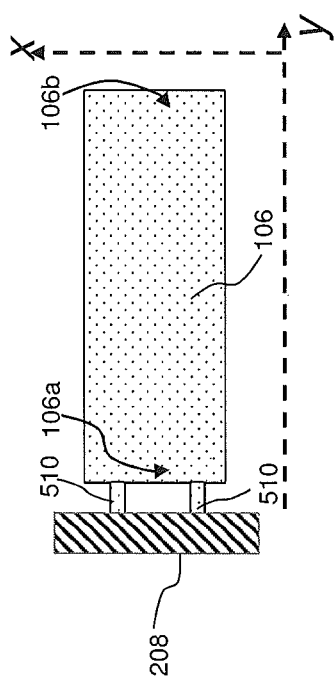

FIGS. 5A to 5D show top views of the resonating structure 106 in accordance to various embodiments. The resonating structure 106 may be anchored to the substrate 102 in various ways. FIG. 5A shows that the resonating structure 106 may be anchored to the substrate 102 through the anchor block 208 at only a first end 106a. FIG. 5B shows that the resonating structure 106 may be anchored to the anchor blocks 208 at both the first end 106a and the second end 106b. FIG. 5C shows that the resonating structure 106 may be coupled to a plurality of anchor beams 510 at only the first end 106a, for anchoring to the anchor block 208. FIG. 5D shows that the resonating structure 106 may be coupled to the plurality of anchor beams 510 at both the first end 106a and the second end 106b, for anchoring to the anchor blocks 208.

Figure 6C:
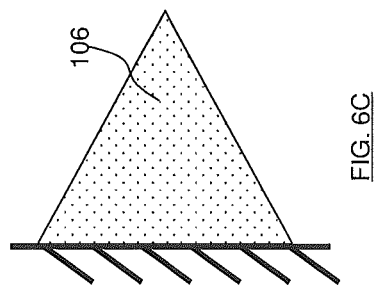
FIGS. 6A to 6E show top views of various MEMS resonators in accordance to various embodiments.
Figure 6B:
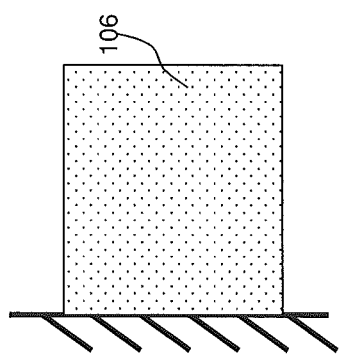
Figure 6E:
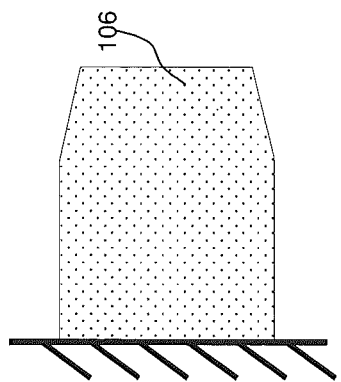
Figure 6A:
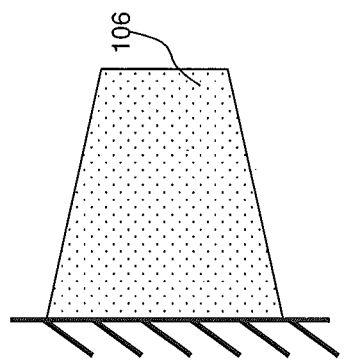
Figure 6D:
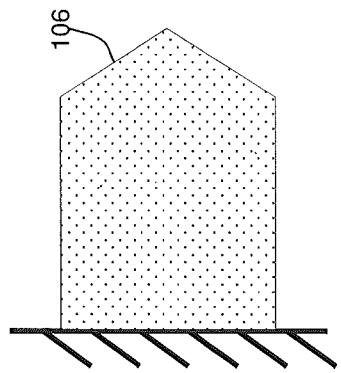

FIGS. 6A to 6E show top views of the resonating structure 106 in accordance to various embodiments. The resonating structure 106 may be a planar structure, similar to a cantilever. The resonating structure 106 may have a top view shape of a polygon. FIG. 6A shows the resonating structure 106 having a top view shape of a trapezoid. The resonating structure 106 with a trapezoidal shape may be able to suppress spurious oscillations when the resonator 100 is resonating in the width-flexural mode. FIG. 6B shows the resonating structure 106 having a top view shape of a rectangle. FIG. 6C shows the resonating structure 106 having a top view shape of a triangle. FIG. 6D shows that the resonating structure 106 may have a top view shape of a combination of a rectangle and a triangle. FIG. 6E shows that the resonating structure 106 may have a top view shape of a combination of a rectangle and a trapezoid.

Figure 7:
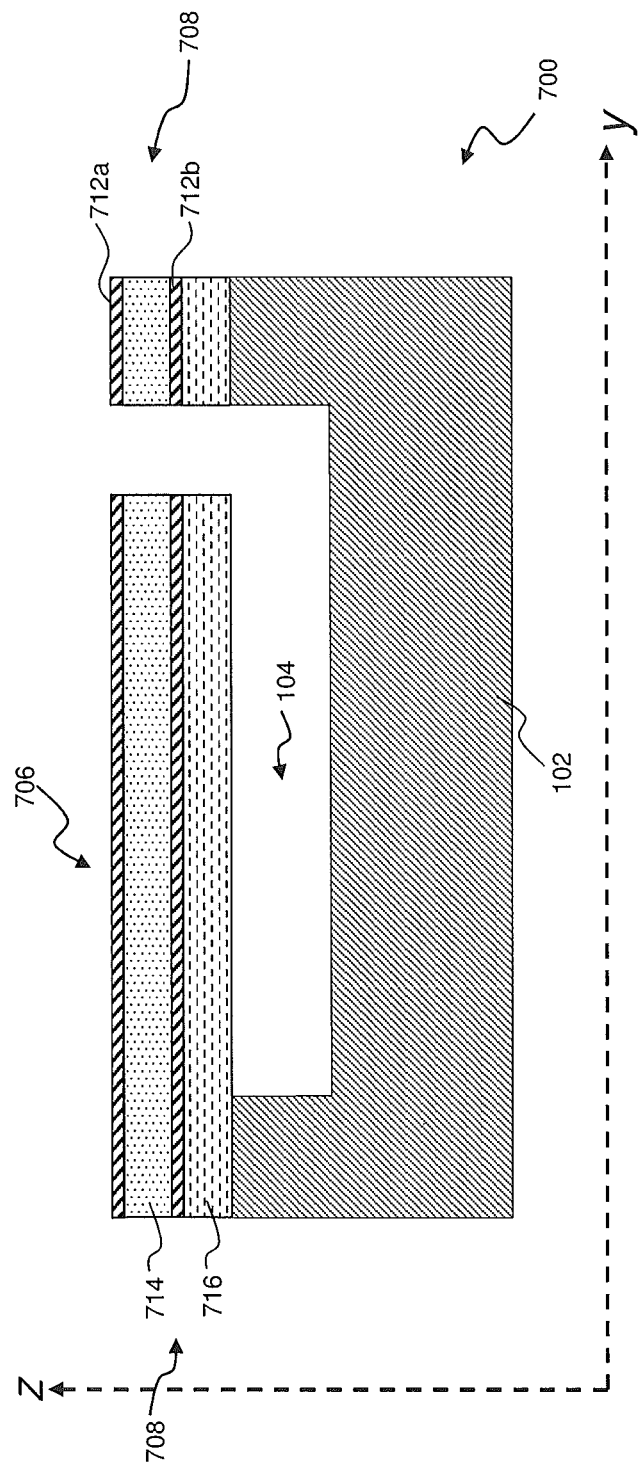
FIG. 7 shows a lengthwise cross-sectional view of a MEMS resonator in accordance to various embodiments.

FIG. 7 shows a lengthwise cross-section of a MEMS resonator 700, according to various embodiments. The MEMS resonator 700 is similar to resonator 100, in that the MEMS resonator 700 may include a substrate 102 with a cavity 104 therein and a resonating structure 706 suspended over the cavity 104 with one end anchored to the substrate 102, wherein the resonating structure 706 is configured to flex in a flexural mode along a width direction of the resonating structure 706. Further to the MEMS resonator 100, the resonating structure 706 in MEMS resonator 700 may include a top electrode layer 712a, a bottom electrode layer 712b and a piezoelectric layer 714 sandwiched between the pair of electrode layers. A support layer 716 may be optionally added, above or underneath the piezoelectric layer 714. The anchor block 708 may have the same composition as the resonating structure 706.

Figure 8:
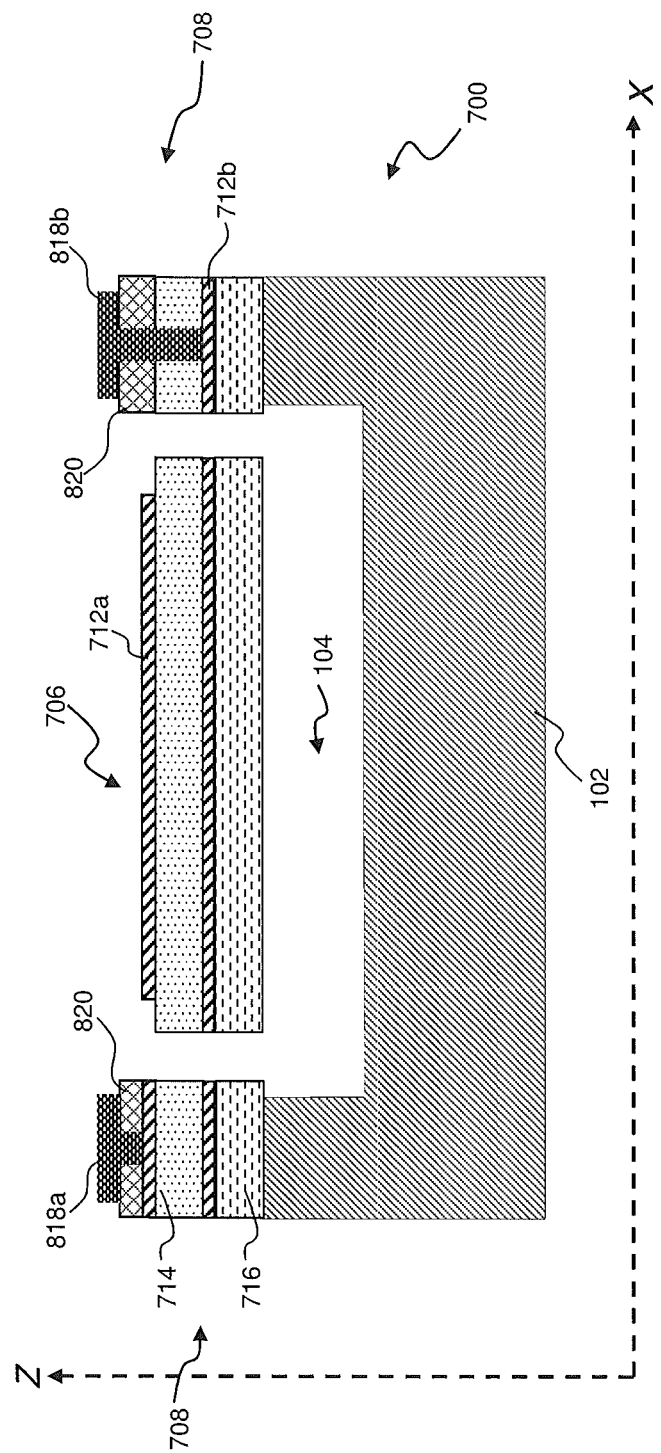
FIG. 8 shows a widthwise cross-sectional view of the MEMS resonator of FIG. 7.

FIG. 8 shows a widthwise cross-section of the MEMS resonator 700 of FIG. 7. The top electrode layer 712a may be positioned on top of and in contact with the piezoelectric layer 714 while the bottom electrode layer 712b may be positioned underneath and in contact with the piezoelectric layer 714. To reduce the resonator impedance, the pair of electrode layers 712a and 712b may be arranged to overlap at least 50% of a surface area of the resonating structure 706.

The top electrode layer 712a and bottom electrode layer 712b may be coupled to a power supply providing an alternating current (AC) voltage. The top electrode layer 712a and bottom electrode layer 712b may be coupled to power connectors 818a and 818b respectively, for coupling to a power supply. The top electrode layer 712a may be patterned such that the top electrode layer 712a covers the piezoelectric layer 714 partially. The power connector 818a may be positioned over a top surface of an insulator layer 820, for example, silicon dioxide, while also extending through the insulator layer 820 to come into contact with the top electrode layer 712a. The power connector 818b may be positioned over the top surface of the insulator layer 820, at a position where there is no underlying top electrode layer 712a, while also extending through the insulator 820 and the piezoelectric layer 714 to come into contact with the bottom electrode layer 712b.

When an AC voltage is applied to the top electrode layer 712a and to the bottom electrode layer 712b, a charge may accumulate on each of the electrode layers, building up an electrostatic field in between the top electrode layer 712a and the bottom electrode layer 712b. As the voltage alternates between its polarities, an alternating electric field may be generated in between the top electrode layer 712a and the bottom electrode layer 712b. The alternating electric field may induce mechanical deformation in the piezoelectric layer 714 and when the frequency of the alternating electric field matches with the natural resonant frequency of the MEMS resonator 700, the MEMS resonator 700 may be driven into a resonance condition. A further DC bias may be applied to the resonator to change a stiffness or spring constant of the resonator, which in turn alters the resonant frequency of the resonator. Therefore, a magnitude of the DC bias may be varied to tune the resonant frequency of the MEMS resonator 700.

The top electrode layer 712a and bottom electrode layer 712b may be made from metallic materials. Materials for the electrode layers may include, but are not limited to, molybdenum (Mo), aluminum (Al), platinum (Pt), chromium (Cr), tungsten (W) and combinations thereof. Materials for the piezoelectric layer 714 may include but are not limited to, aluminum nitride (AlN), zinc oxide (ZnO), lead zirconium titanate (PZT), gallium nitride (GaN), quartz and combinations or alloys thereof. The optional support layer 716 may provide tensile strength and high quality factor to the resonating structure 706. As the resonant frequency of the resonator is related to a thickness of the resonating structure, the support layer thickness may be selected to achieve the desired resonant frequency. Materials for the support layer 716 may include, but are not limited to, silicon, aluminum nitride or their combination thereof.

Figure 9:
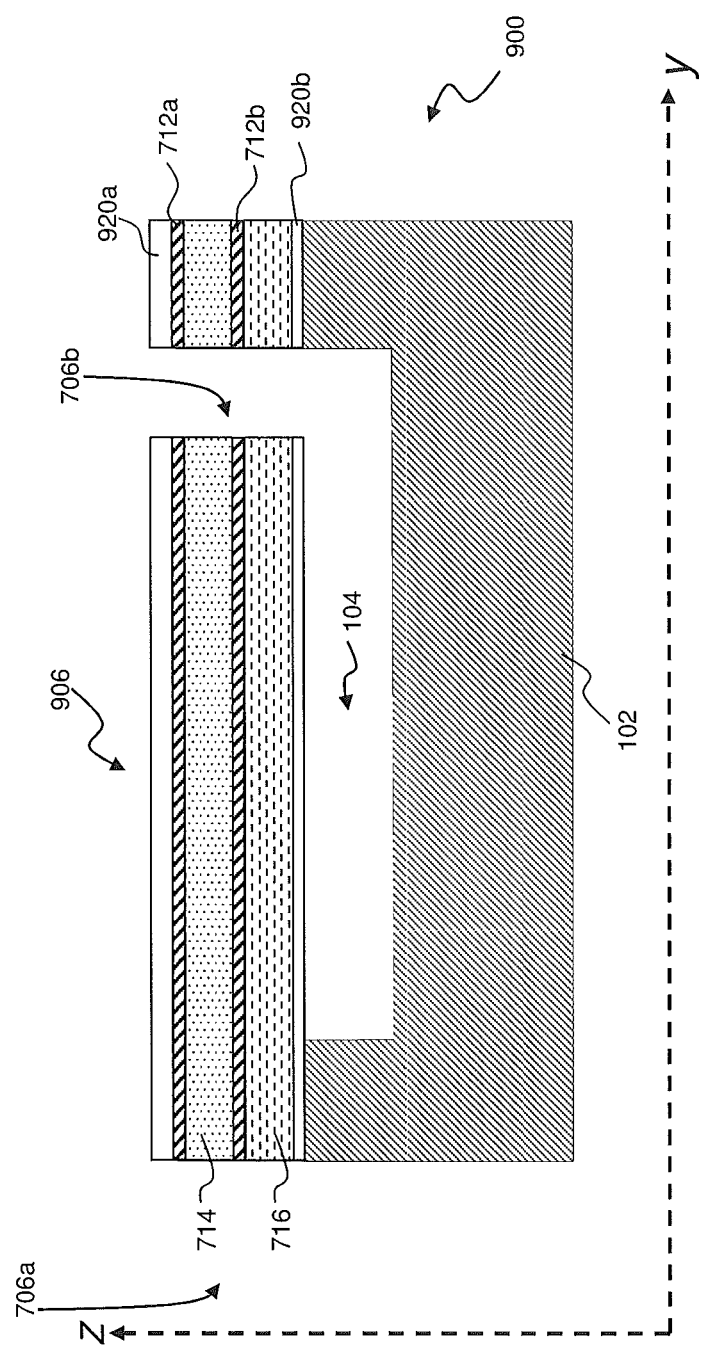
FIG. 9 shows a lengthwise cross-sectional view of a MEMS resonator in accordance to various embodiments.

FIG. 9 shows a lengthwise cross-section of a MEMS resonator 900 in accordance to various embodiments. The MEMS resonator 900 may include a substrate 102 with a cavity 104 formed therein and a resonating structure 906. The resonating structure 906 may be similar to the resonating structure 706 of FIG. 7 and FIG. 8, but further including at least one temperature compensation of frequency layer formed from a material that has a positive temperature coefficient of frequency (TCF). FIG. 9 shows the MEMS resonator 900 may include a first temperature compensation of frequency layer 920a and a second temperature compensation of frequency layer 920b. The first temperature compensation of frequency layer 920a is positioned over the top electrode layer 712a while the second temperature compensation of frequency layer 920b is positioned underneath the support layer 716.

Any one of the first temperature compensation of frequency layer 920a and the second temperature of frequency layer 920b may be less than 4 um in thickness. Each of the first temperature compensation of frequency layer 920a and the second temperature of frequency layer 920b may also be less than 2 um in thickness. The first and second temperature compensation of frequency layers 920a and 920b may be formed from silicon dioxide or other suitable materials with positive TCF values.

Figure 10:
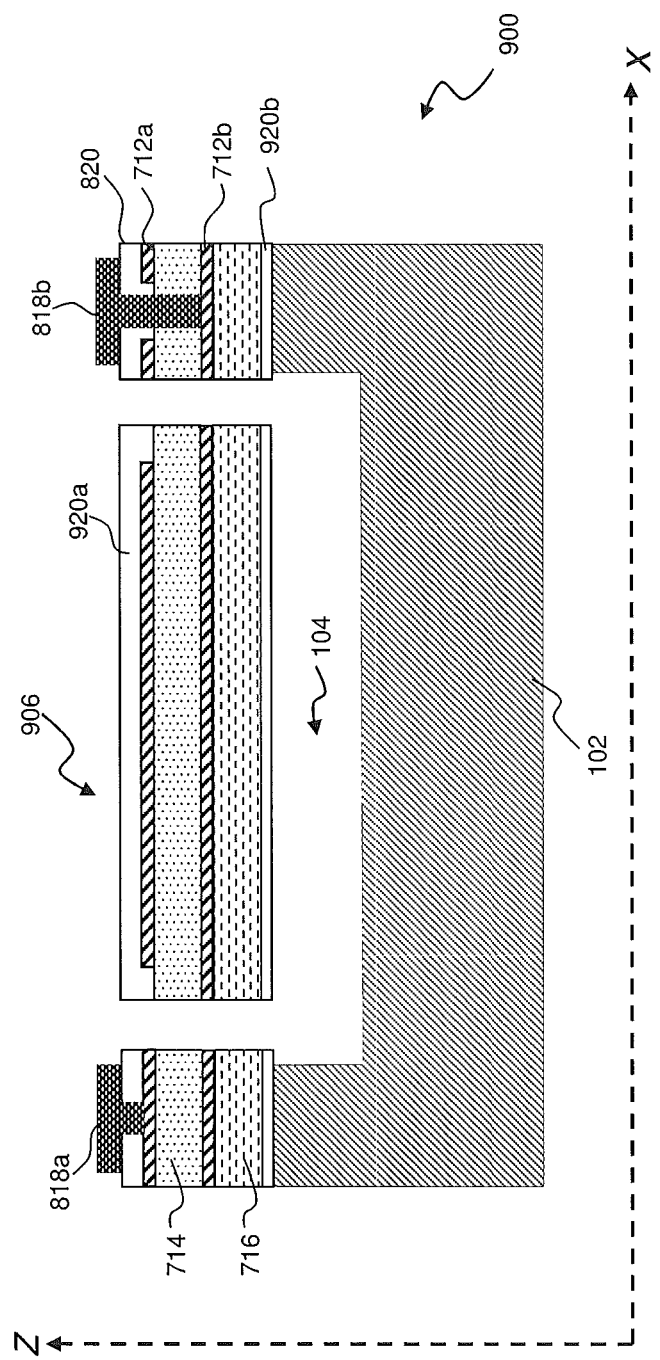
FIG. 10 shows a widthwise cross-sectional view of the MEMS resonator of FIG. 9.

FIG. 10 shows a widthwise cross-section of the MEMS resonator 900 of FIG. 9. The top electrode layer 712a and bottom electrode layer 712b may be coupled to power connectors 818a and 818b respectively, for coupling to a power supply. The power connector 818a may be positioned over a top surface of an insulator layer 820, while also extending through the insulator layer 820 to come into contact with the top electrode layer 712a. The power connector 818b may be positioned over the top surface of the insulator layer 820, while also extending through the insulator 820, the top electrode layer 712a and the piezoelectric layer 714 to come into contact with the bottom electrode layer 712b. The insulator layer 820 may extend into a portion of the top electrode layer 712a where the power connector 818b is positioned, so as to isolate the power connector 818b from the top electrode layer 712a. The insulator layer 820 may be formed from the same material as the first temperature compensation of frequency layer 920a.

An ideal resonator should resonate at a constant frequency regardless of environmental conditions. In reality, most resonators have a negative temperature coefficient of frequency (TCF), which means that resonant frequency of the resonator increases with an increase in temperature. The MEMS resonator 900 may achieve a substantially constant resonant frequency throughout its operating temperature range, as the at least one temperature compensation of frequency layer may offset the inherent negative TCF value of the MEMS resonator. The operating temperature range of the MEMS resonator 900 may be within −20° C. to +120° C.

Figure 11:
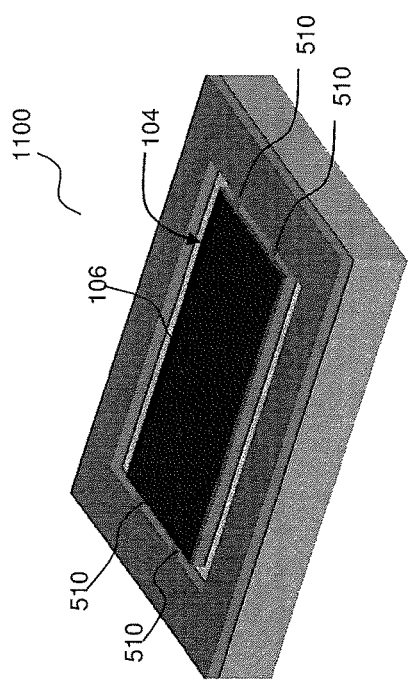
FIG. 11 shows a perspective view of a MEMS resonator in accordance to various embodiments.

FIG. 11 shows a perspective view of a MEMS resonator 1100 having a resonating structure 106 of FIG. 5D, in accordance to various embodiments. The resonating structure 106 has four anchor beams 510, for anchoring the resonating structure 106 to the substrate.

Figure 12:
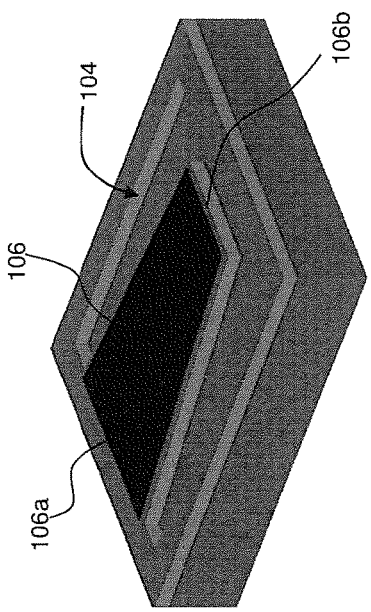
FIG. 12 shows a perspective view of a MEMS resonator in accordance to various embodiments.

FIG. 12 shows a perspective view of a MEMS resonator 1110 with a resonating structure 106 of FIG. 6A, in accordance to various embodiments. The resonating structure 106 may have a top view shape of a trapezoid. The resonating structure 106 has a first end 106a and a second end 106b. The resonating structure 106 may be anchored to the substrate at the first end 106a. The first end 106a may be wider than the second end 106b.

Figure 13:
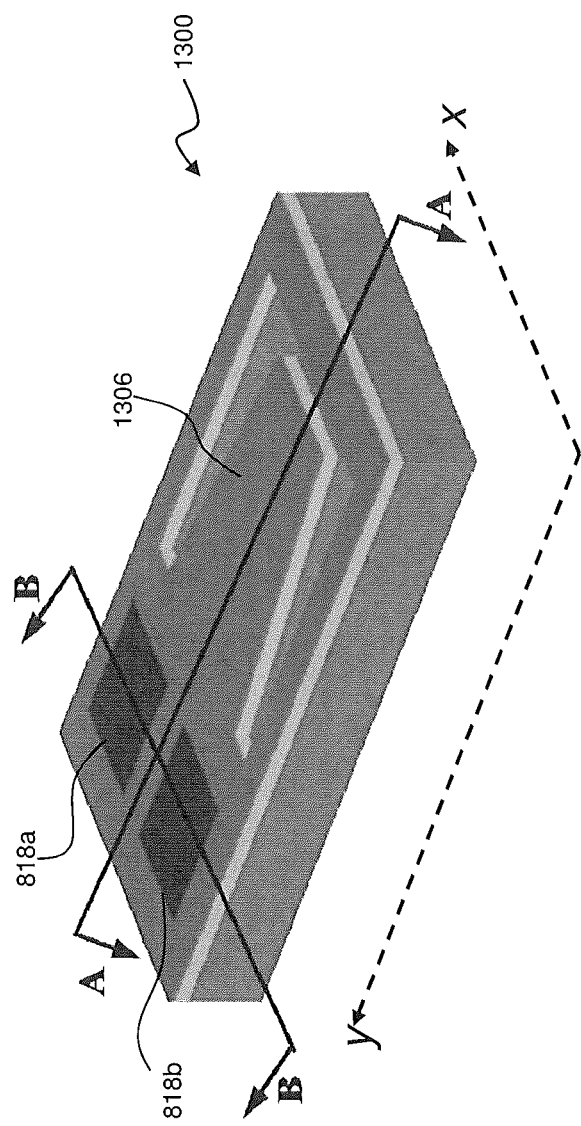
FIG. 13 shows a perspective view of a MEMS resonator according to various embodiments.

FIG. 13 shows a MEMS resonator 1300 in accordance to various embodiments. The plane in which the resonating structure 1306 lies in may be defined as the xy-plane. The directions of the x-axis and the y-axis are illustrated in FIG. 13. The MEMS resonator 1300 may have a first power connector 818a and a second power connector 818b positioned away from the resonating structure 1306 in the y-axis. A line A-A is parallel to the y-axis and bisects the MEMS resonator 1300 at its width. A line B-B is parallel to the x-axis and cuts across the MEMS resonator 1300 where the first power connector 818a and second power connector 818b lie.

FIG. 14 provides a lengthwise cross-sectional view of the MEMS resonator 1300, along the A-A line. The top electrode layer 712a may extend through the full length of the resonating structure 1306, but may be shorter than the bottom electrode layer 712b which may extend through the full length of the MEMS resonator 1300. The substrate 102 may lie above a further insulator layer 1324. The further insulator layer 1324 may include insulator materials such as silicon dioxide.

FIG. 15 shows the widthwise cross-section of the resonator 1300, along the B-B line, which is across a portion of the MEMS resonator that excludes the resonating structure 1306. As shown in FIG. 15, the power connectors 818a and 818b are positioned in the portion of the resonator that excludes the resonating structure 1306. The top electrode layer 712a may have a shorter width as compared to the bottom electrode layer 712b, such that the top electrode layer 712a may not come into contact with the power connector 818b.

According to various embodiments, more than one resonating structure may be coupled to a single substrate with a single cavity or one resonating structure may be paired with more than a single cavity.

In the following, a numerical simulation of a resonator according to various embodiments will be described. A MEMS resonator according to various embodiments can be simulated and analyzed using finite element method software, with input parameters provided for excitation voltage and tuning voltage. For the input parameters of an excitation voltage of 1V AC having a frequency of 6.25 MHz and a tuning voltage of 0V to 20V DC bias, the simulated mode shape is as shown in FIGS. 16A and 16B.

FIG. 16A shows a resonator 100 operating in a length flexural mode. The resonating structure 106 may have a top view shape of a trapezoid. The resonating structure 106 may have a first end 106a anchored to the substrate and a second end 106b which may be freely moveable. In the length flexural mode, the resonating structure 106 may have a maximum out-of-plane displacement occurring at the second end 106b.

FIG. 16B shows the resonator 100 operating in a width flexural mode. In the width flexural mode, the maximum displacement occurs at the two non-parallel edges of the trapezoid, i.e. 106c and 106d and at positions near the anchor. The direction of the displacement is out of the resonator plane; whereas for the two parallel edges, the longer edge 106a is anchored to the substrate, thus zero displacement is observed, while very small or zero displacement is also observed on the shorter edge 106b.

Figure 17B:
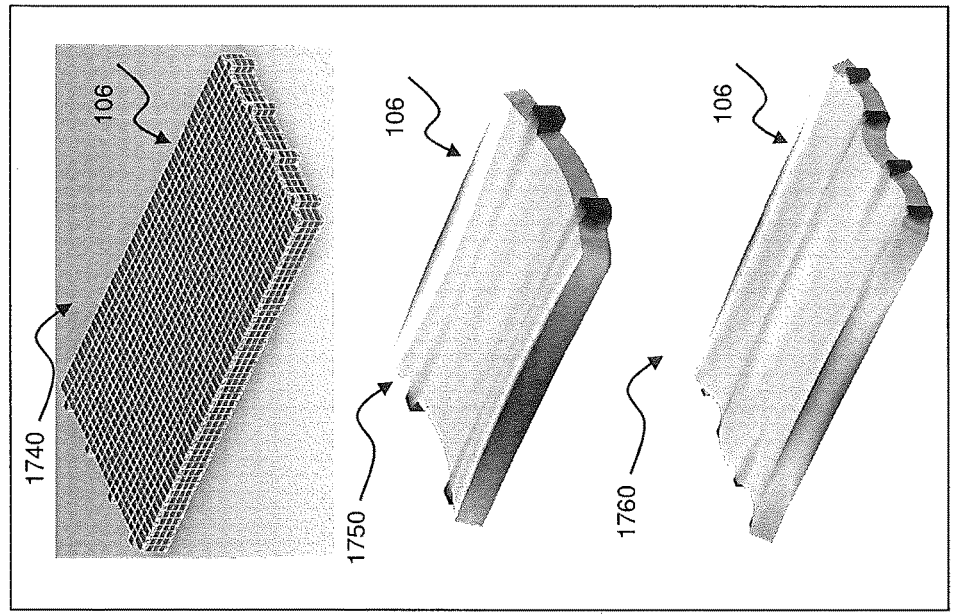
FIG. 17B shows perspective views of the MEMS resonator of FIG. 17A, operating in various flexural modes.
Figure 17A:
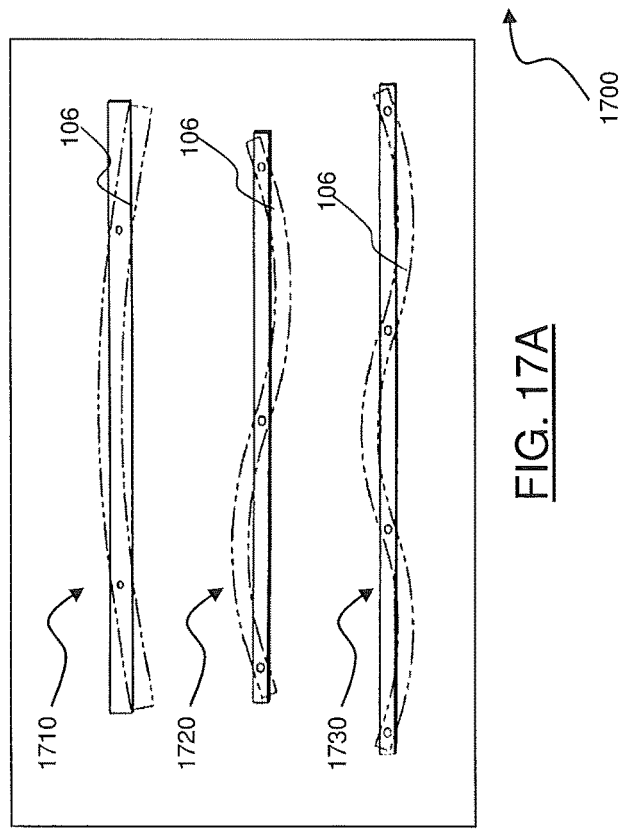
FIG. 17A shows various flexural modes of a MEMS resonator according to various embodiments.

FIG. 17A shows widthwise cross-sectional views of a resonating structure according to various embodiments, operating at various resonant frequencies. 1710 is the resonating structure 106 operating in the fundamental mode. 1720 is the resonating structure 106 operating in the second overtone and 1730 is the resonating structure 106 operating in the third overtone. The resonating structure may operate at various width-flexural resonant frequencies, including the fundamental resonant frequency, as well as at higher order overtones.

FIG. 17B shows perspective views of the resonating structure of FIG. 17A operating at various resonant frequencies. 1740 is the resonating structure 106 in a resting position. 1750 is the resonating structure 106 operating in the fundamental mode. 1760 is the resonating structure 106 operating in the third overtone mode.

Figure 18:
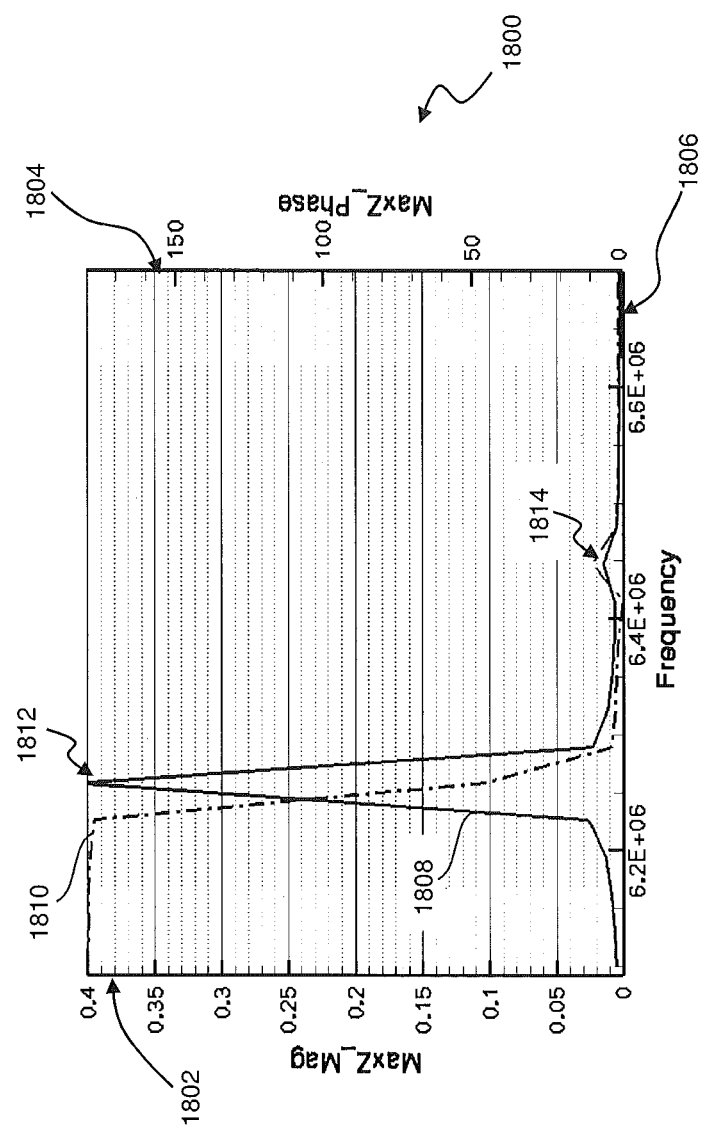
FIG. 18 is a graph showing changes in harmonic displacement and phase in response to changes in frequency for the MEMS resonator of FIG. 16B.

FIG. 18 shows a graph 1800 having a first vertical axis 1802, a second vertical axis 1804 and a horizontal axis 1806. The first vertical axis 1802 indicates the displacement magnitude; the second vertical axis 1804 indicates the phase while the horizontal axis 1806 indicates the resonator operating frequency. The graph 1800 includes a continuous line 1808 representing the displacement and a broken line 1810 representing the phase. The graph 1800 shows a first peak 1812 occurring at about 6.26 MHz which is the width flexural mode resonant frequency; and a second peak 1814 occurring at about 6.45 MHz which is the length flexural mode resonant frequency. As can be seen from the graph 1800, the width flexural mode provides a much larger flexural magnitude than the length flexural mode.

Figure 19:
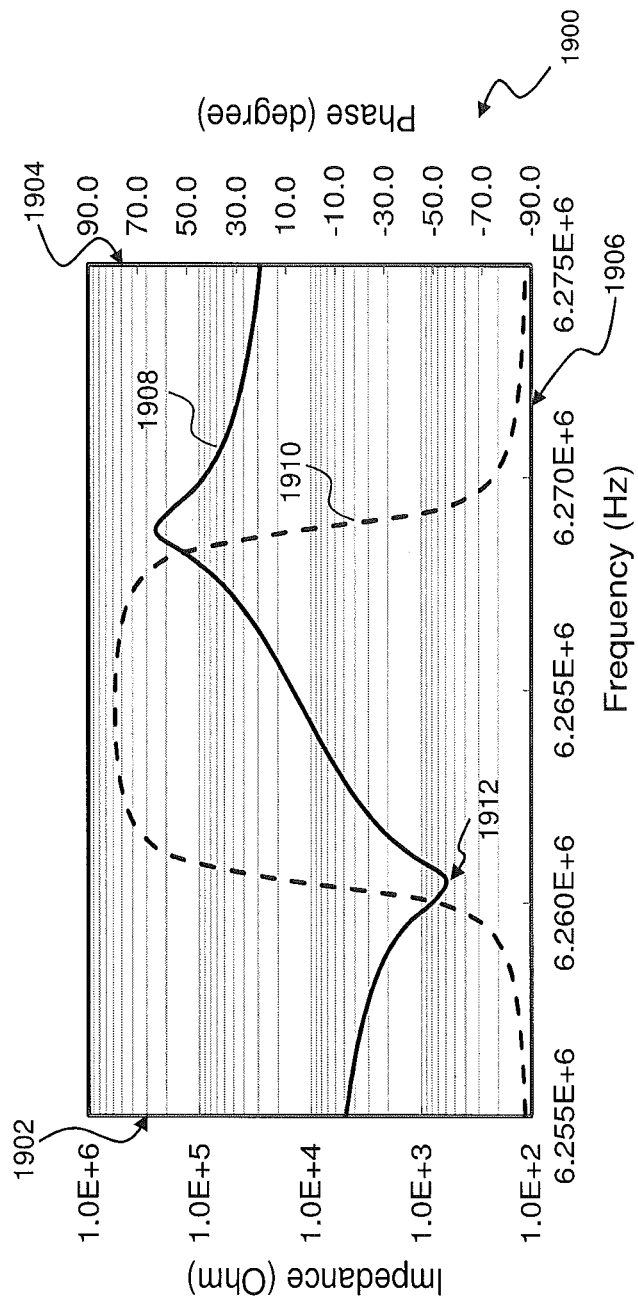
FIG. 19 is a graph showing changes in impedance and phase in response to changes in frequency for the MEMS resonator of FIG. 16B.

FIG. 19 shows a graph 1900 having a first vertical axis 1902, a second vertical axis 1904 and a horizontal axis 1906. The first vertical axis 1902 indicates motional impedance, the second vertical axis 1904 indicates phase while the horizontal axis 1906 indicates frequency. The graph 1900 includes a continuous line 1908 representing motional impedance and a broken line 1910 representing phase. The graph 1900 shows that at the width flexural mode resonant frequency of about 6.26 MHz, the motional impedance of the resonator dips to a minimum value 1912.

Figure 20:
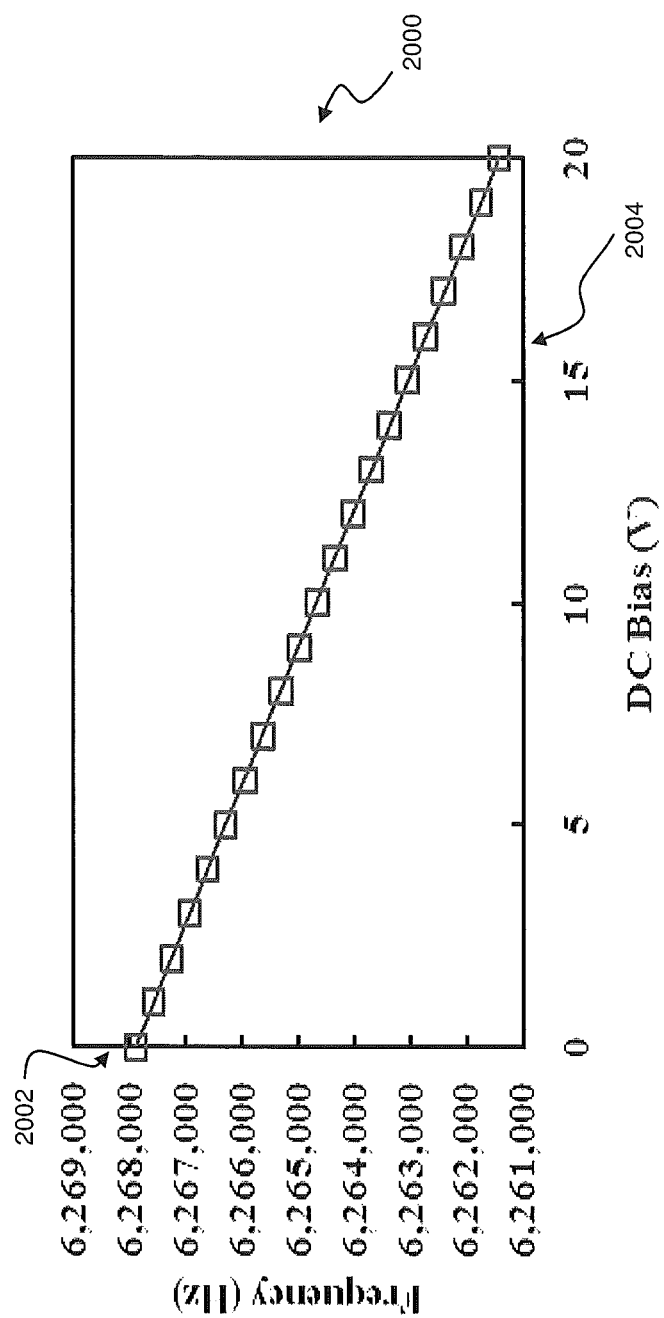
FIG. 20 is a graph showing changes in resonant frequency in response to changes in DC bias of the AC power supply, for the MEMS resonator of FIG. 16B.

FIG. 20 shows a graph 2000, with a vertical axis 2002 and a horizontal axis 2004. The vertical axis 2002 indicates the resonant frequency while the horizontal axis 2004 indicates the DC bias voltage. As can be seen from FIG. 20, the resonant frequency decreases with an increase in the DC bias voltage. This DC bias dependency of the resonant frequency can be used for frequency tuning of the resonator, i.e. the resonant frequency of the resonator can be tuned by adjusting the DC bias.

Figure 22:
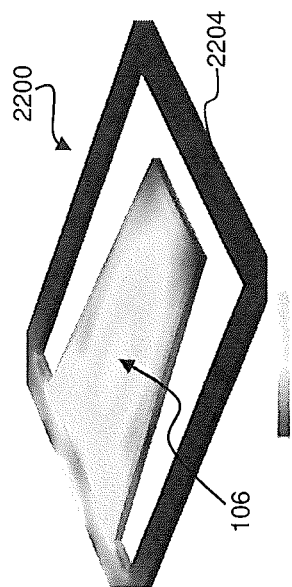
FIG. 22 shows the simulated thermoelastic stress distribution of the MEMS resonator of FIG. 16B.
Figure 21:
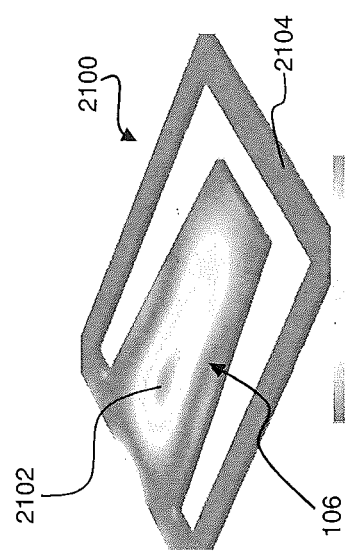
FIG. 21 shows the simulated thermoelastic damping energy density distribution of the MEMS resonator of FIG. 16B.

FIG. 21 shows a simulated model 2100, of a resonator according to various embodiments. The simulated model 2100 shows a simulated thermoelastic damping energy density distribution across the resonating structure. The resonating structure 106 has a centre portion 2102 which has a highest damping energy density while the resonator edge 2104 has a lowest damping energy density. FIG. 22 shows a simulated model 2200, of the resonator of FIG. 21. The simulated model 2200 shows a simulated thermoelastic damping stress distribution across the resonating structure. The simulated model 2200 shows that the resonating structure 106 has a higher thermo-elastic damping stress distribution as compared to the resonator edges 2204.

Figure 23:
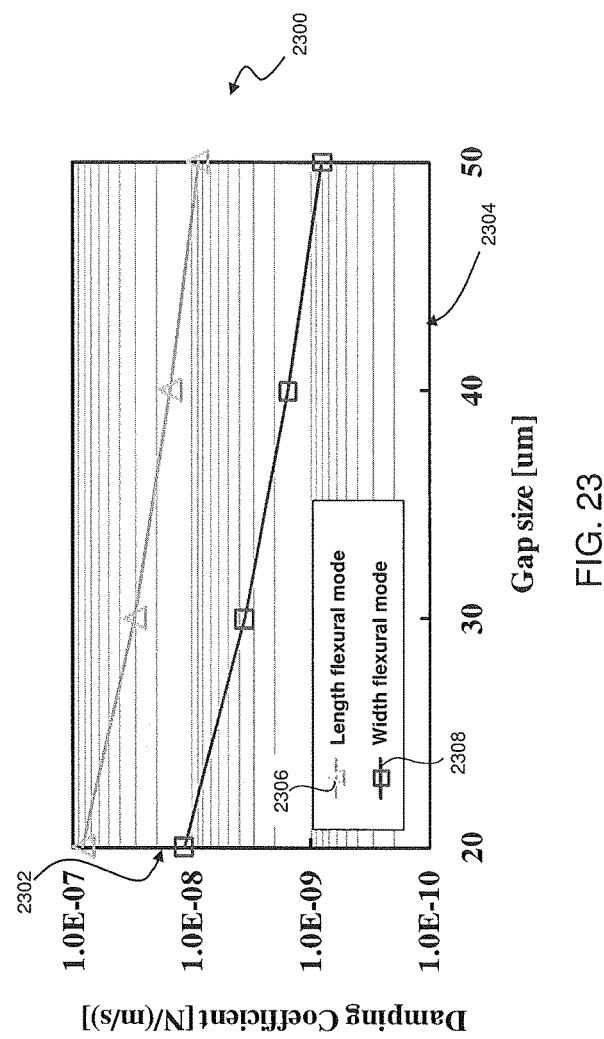
FIG. 23 is a graph showing changes in damping coefficient in response to changes in gap size, for the MEMS resonator of FIG. 16B.

Air damping coefficient of the length-flexural mode and the width-flexural mode of the trapezoidal-shape resonator under 1 atmospheric pressure can be calculated from the simulation results, with the air damping coefficient for various gap sizes included. FIG. 23 shows a graph 2300, having a vertical axis 2302 and a horizontal axis 2304. The vertical axis 2302 indicates the damping coefficient of the resonator while the horizontal axis 2304 indicates the gap size of the resonator. The triangular marker 2306 indicates the plots for the damping coefficients at various gap sizes, when the resonator is operating in the length flexural mode. The square marker 2308 indicates the plots for the damping coefficients at various gap sizes, when the resonator is operating in the width flexural mode. From FIG. 23, it can be clearly seen that for each value of gap size, the air damping coefficient of the width-flexural mode is almost one order less than that of the length flexural mode of the trapezoidal-shape micromechanical resonator. As a result, the resonator operating in its width-flexural mode will have a higher quality factor than the resonator operating in its length flexural mode.

The overall resonator Q factor can be calculated as follows without considering other loss mechanisms such as material loss and surface acoustic wave loss:

$$\frac{1}{Q_{Total}} = \frac{1}{Q_{gas}} + \frac{1}{Q_{TED}} + \frac{1}{Q_{anc}}$$

$Q_{gas}$ represents the energy lost due to friction with $Q_{TED}$ represents the energy loss due to thermoelastic damping, $Q_{anc}$ represents the energy lost through the anchors. The combined effect of $Q_{TED}$ is measured in the simulation to be 1/1.18715E−4=8403, at the width flexural resonant frequency of 6.25 MHz, while $Q_{anc}$ is estimated to be 12,000. Using the above measurements, $Q_{Total}$ is calculated to be about 5000 at 6.25 MHz in a vacuum. The measured $Q_{Total}$ is around 4500 at 6.25 MHz in vacuum till 40 Torr, and the corresponding measured impedance in vacuum is around 600Ω. In air, the measured $Q_{Total}$ is around 1100 at 6.25 MHz and the corresponding measured impedance in air is around 2 kΩ.

The simulation results show that the resonator can achieve a much higher quality factor by operating in its width-flexural mode, as compared to operating in its length flexural mode. While both operation modes will be subjected to a substantial energy loss due to air damping, the resonator is still able to achieve a high quality factor in air by operating in its width-flexural mode. The resonator impedance in air is also reasonably low at 2 kΩ.

In the following, a preliminary experiment and the resulting measurements of a resonator according to various embodiments will be described.

Figure 24:
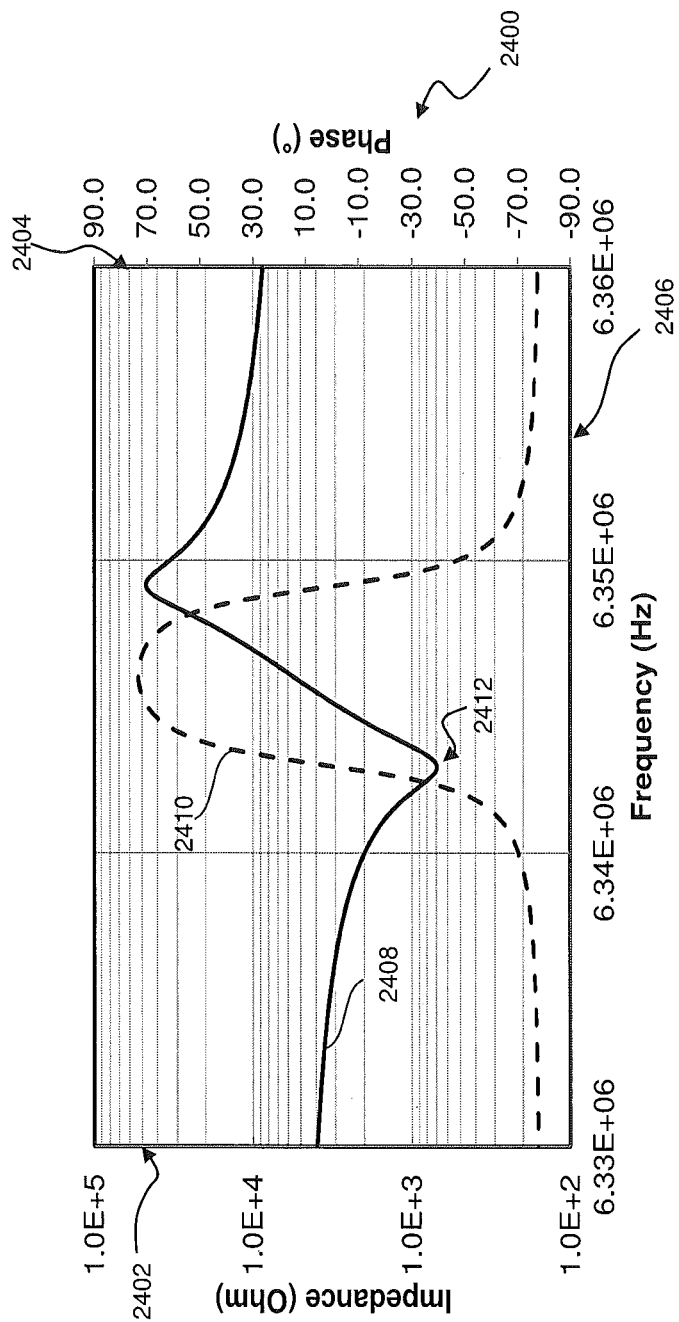
FIG. 24 shows a graph of the frequency response of a MEMS resonator in vacuum, in accordance to various embodiments.

A impedance analyzer can be used to characterize the fabricated device by outputting the impedance and phase of the resonator. FIG. 24 shows the frequency response of the resonator in a vacuum. The measured impedance is plotted against the operating frequency, as shown in graph 2400. The graph 2400 has a first vertical axis 2402 indicating motional impedance value in Ohms, a second vertical axis 2404 indicating phase and a horizontal axis 2406 indicating the resonator operating frequency. The graph 2400 includes a continuous line 2408 representing the impedance and a broken line 2410 representing the phase. As shown in FIG. 24, the minimum impedance value 2412 occurs at the resonant frequency of about 6.343 MHz, slightly higher than the simulation value of 6.26 MHz.

The impedance at the resonant frequency is about 680Ω, Based on the measurement raw data, the impedance analyzer computes and displays the Q-factor of the resonator based on a 3 dB rule. The Q-factor of the resonator was determined to be about 4500. The phase change near the resonance region is more than 150°, which eases the integrated circuit requirement to build the oscillator.

Figure 25:
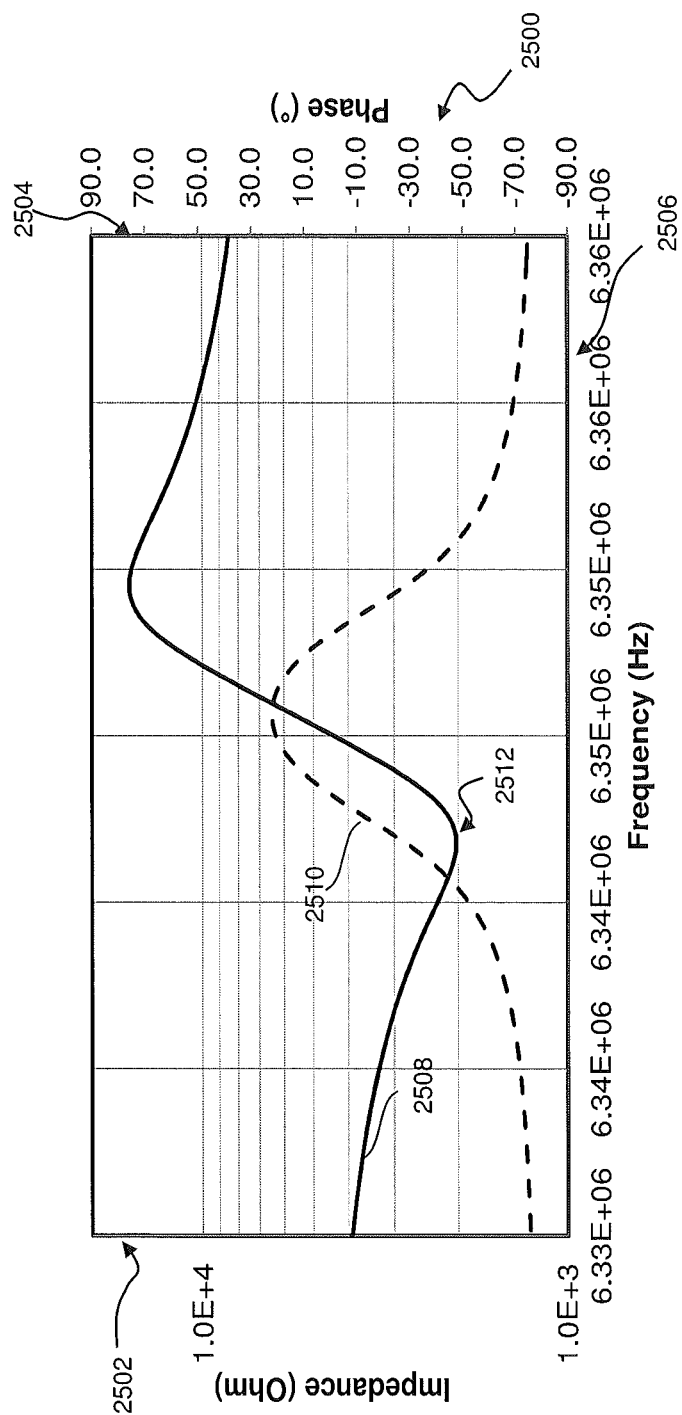
FIG. 25 shows a graph of the frequency response of the MEMS resonator of FIG. 24 in air.

FIG. 25 shows a graph 2500, which shows the frequency response of the resonator in air. The graph 2500 includes a first vertical axis 2502, a second vertical axis 2504 and a horizontal axis 2506. The first vertical axis 2502 indicates the impedance, while the second vertical axis 2504 indicates the phase. The horizontal axis indicates the resonator operating frequency. The graph 2500 includes a continuous line 2506 representing the insertion loss and a broken line 2508 representing the phase. When operating in air, the resonant frequency remains relatively constant at 6.343 MHz. The impedance dips to a minimum 2512 of about 2 kΩ at the resonant frequency. Based on the measurement raw data, the impedance analyzer computes the Q-factor of the resonator to be about 1100. The drop in the quality factor indicates that air damping dominates the energy loss mechanisms. The measured phase change near the resonance region reduces to about 90°.

Since quality factor is the performance parameter which is affected by the pressure to the greatest extent among all other measured performance parameters of the exemplary trapezoidal-shape width-flexural mode resonator, it is worth to study the effect of the ambient pressure on the measured quality factor.

Figure 26:
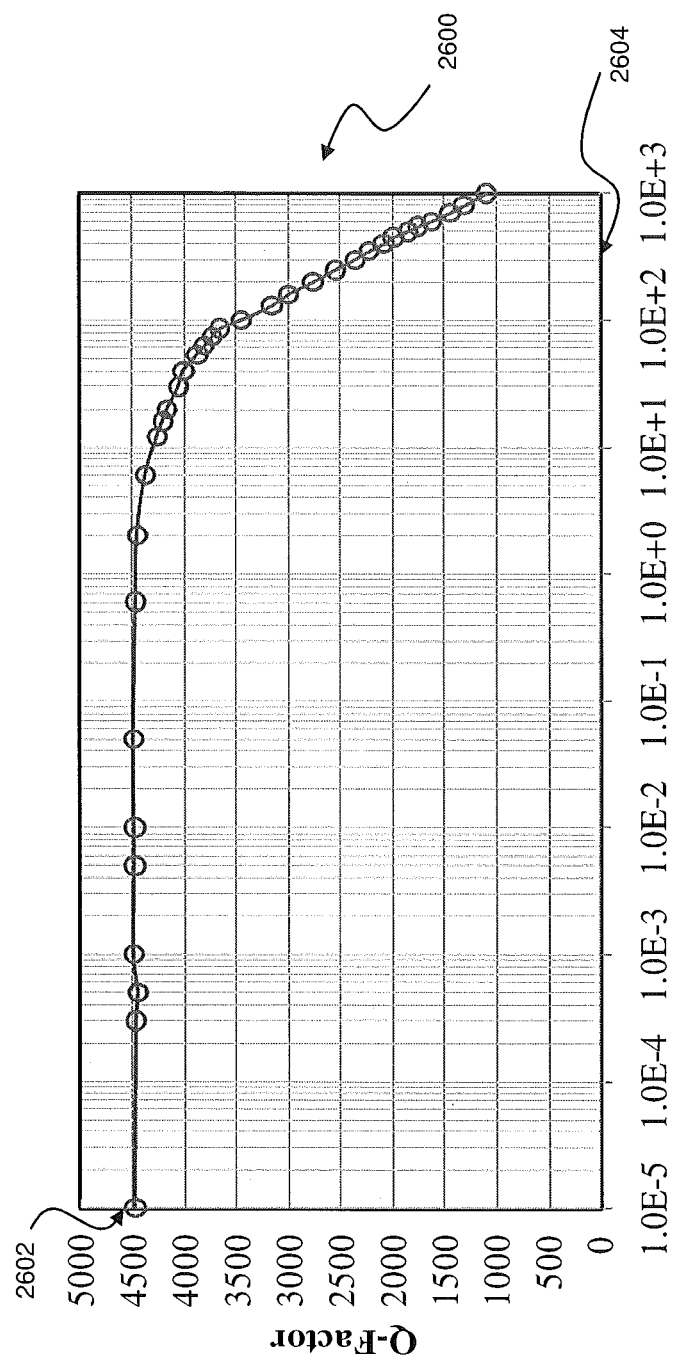
FIG. 26 shows a graph of the quality factor of the MEMS resonator of FIG. 24 plotted against pressure.

FIG. 26 shows a graph 2600, which depicts the experimentally measured quality factor at various pressure levels. The graph 2600 includes a vertical axis 2602 and a horizontal axis 2604. The vertical axis 2602 indicates the quality factor, while the horizontal axis 2604 indicates the air pressure. As shown in FIG. 26, the quality factor can be maintained at about 4500 when pressure increases up to 7.5 Torr (1000 Pa); the quality factor can still reach 3500 at a pressure level of 75 Torr (10000 Pa); and a quality factor of more than 1000 can be obtained in air at atmospheric pressure.

Figure 27:
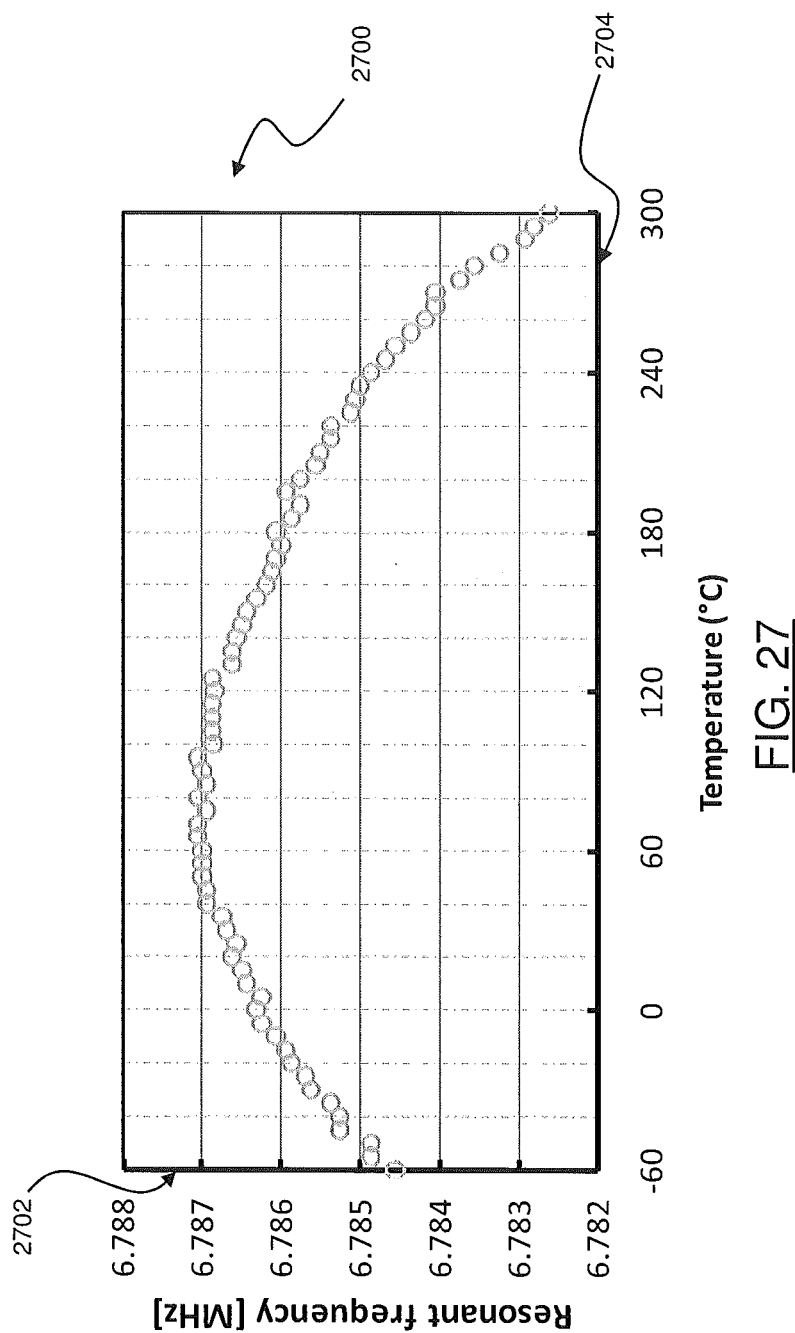
FIG. 27 shows a graph of the resonant frequency of the MEMS resonator of FIG. 24 plotted against temperature.

The temperature coefficient of frequency (TCF) of the exemplary trapezoidal-shape width-flexural mode resonator is also characterized and the results are shown in FIG. 27. FIG. 27 shows a graph 2700, which depicts the effect of temperature on the resonant frequency of the resonator. The graph 2700 includes a vertical axis 2702 and a horizontal axis 2704. The vertical axis 2702 indicates the resonant frequency, while the horizontal axis 2704 indicates the temperature. From the data shown in FIG. 27, the overall TCF is calculated to be 14.4 ppm i.e. −0.18 ppm/° C. over temperature range 40° C.~120° C. and 120 ppm i.e. 2 ppm/° C. over the temperature range −20° C.~40° C. The resonant frequency increases from −60° C.~60° C. and decreases from around 100° C.~300° C. with the increasing temperature. The resonant frequency remains fairly constant in the temperature range of 60° C.~100° C. The slightly negative TCF in the temperature region of 40° C.~120° C. can be compensated by adding at least one temperature compensation of frequency layer to the resonating structure.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced. It will be appreciated that common numerals, used in the relevant drawings, refer to components that serve a similar or the same purpose.

The invention claimed is:

1. A micro-electromechanical resonator comprising:
   a substrate with a cavity therein; and
   a resonating structure suspended over the cavity, the resonating structure having a first end anchored to the substrate,
   wherein the resonating structure is configured to flex in a flexural mode along a width direction of the resonating structure, wherein the width direction is defined at least substantially perpendicular to a length direction of the resonating structure, wherein the length direction is defined from the first end to a second end of the resonating structure, wherein the second end opposes the first end, and
   wherein a resonant frequency of the resonator is tunable through an adjustment of a direct current voltage bias.

2. The micro-electromechanical resonator as in claim 1, wherein the resonating structure is shaped substantially planar.

3. The micro-electromechanical resonator as in claim 1, wherein the resonating structure is shaped substantially polygonal.

4. The micro-electromechanical resonator as in claim 3, wherein the resonating structure is shaped substantially trapezoidal.

5. The micro-electromechanical resonator as in claim 4, wherein the first end is longer than the second end.

6. The micro-electromechanical resonator as in claim 1, wherein the resonating structure is anchored to the substrate at both the first end and the second end.

7. The micro-electromechanical resonator as in claim 1, wherein the resonating structure has a length of less than twice of a maximum width.

8. The micro-electromechanical resonator as in claim 1, wherein the resonating structure comprises an actuation mechanism.

9. The micro-electromechanical resonator as in claim 1, wherein the resonating structure comprises
   a first electrode layer and a second electrode layer; and
   a piezoelectric layer positioned between the first electrode layer and the second electrode layer.

10. The micro-electromechanical resonator as in claim 9, wherein the resonating structure further comprises a support layer coupled to the piezoelectric layer, the support layer comprising at least one selected from the group consisting of silicon, aluminum nitride or their combination thereof.

11. The micro-electromechanical resonator as in claim 9, further comprising a control circuit, wherein the control circuit is configured to apply an alternating current voltage to at least one of the first electrode layer and the second electrode layer, for generating an alternating electric field across the piezoelectric layer to induce mechanical deformation in the piezoelectric layer.

12. The micro-electromechanical resonator as in claim 11, wherein the alternating electric field alternates at an input frequency, wherein the input frequency is at least substantially equal to a width flexural resonant frequency of the resonating structure.

13. The micro-electromechanical resonator as in claim 9, wherein at least one from the group consisting of the first electrode layer and the second electrode layer at least overlaps a partial surface area of the piezoelectric layer.

14. The micro-electromechanical resonator as in claim 13, wherein the partial surface area of the piezoelectric layer is at least half of a surface area of the resonating structure.

15. The micro-electromechanical resonator as in claim 9, wherein the resonating structure further comprises a first temperature compensation of frequency layer, wherein the first temperature compensation of frequency layer comprises a material with a positive temperature coefficient of frequency.

16. The micro-electromechanical resonator as in claim 15, wherein the first temperature compensation of frequency layer comprises silicon dioxide.

17. The micro-electromechanical resonator as in claim 15, wherein the resonating structure further comprises a second temperature compensation of frequency layer, wherein the second temperature compensation of frequency layer comprises a material with a positive temperature coefficient of frequency.

18. The micro-electromechanical resonator as in claim 17, wherein the second temperature compensation of frequency layer comprises silicon dioxide.

19. A method of providing a reference frequency, the method comprising:
- providing a micro-electromechanical resonator, the micro-electromechanical resonator comprising
  - a substrate with a cavity therein, and
  - a resonating structure suspended over the cavity, the resonating structure having a first end anchored to the substrate; and
- controlling the resonating structure to flex in a flexural mode along a width direction of the resonating structure, wherein the width direction is defined at least substantially perpendicular to a length direction of the resonating structure, wherein the length direction is defined from the first end to a second end of the resonating structure, wherein the second end opposes the first end, and wherein a resonant frequency of the resonator is tunable through an adjustment of a direct current voltage bias.

* * * * *